(12) United States Patent
Choi et al.

(10) Patent No.: US 12,107,063 B2
(45) Date of Patent: Oct. 1, 2024

(54) SEMICONDUCTOR PACKAGE DEVICE

(71) Applicant: Samsung Electronics Co., Ltd., Suwon-si (KR)

(72) Inventors: Ju-Il Choi, Seongnam-si (KR); Gyuho Kang, Cheonan-si (KR); Heewon Kim, Suwon-si (KR); Junyoung Park, Anyang-si (KR); Seong-Hoon Bae, Cheonan-si (KR); Jin Ho An, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 11 days.

(21) Appl. No.: 17/204,313

(22) Filed: Mar. 17, 2021

(65) Prior Publication Data

US 2022/0020714 A1 Jan. 20, 2022

(30) Foreign Application Priority Data

Jul. 15, 2020 (KR) .......................... 10-2020-0087594

(51) Int. Cl.
*H01L 23/38* (2006.01)
*H01L 23/00* (2006.01)
(Continued)

(52) U.S. Cl.
CPC ........ *H01L 24/14* (2013.01); *H01L 23/53238* (2013.01); *H01L 23/5386* (2013.01);
(Continued)

(58) Field of Classification Search
CPC .............. H01L 24/14; H01L 23/53238; H01L 23/5386; H01L 2224/0401; H01L 2224/13024
See application file for complete search history.

(56) References Cited

U.S. PATENT DOCUMENTS

| 5,736,790 A | 4/1998 | Iyogi et al. |
| 8,207,450 B2 | 6/2012 | An et al. |

(Continued)

FOREIGN PATENT DOCUMENTS

| JP | 3457926 B2 | 10/2003 |
| KR | 101837511 B1 | 3/2018 |

(Continued)

*Primary Examiner* — Trang Q Tran
(74) *Attorney, Agent, or Firm* — HARNESS, DICKEY & PIERCE, P.L.C.

(57) ABSTRACT

A semiconductor package device may include a redistribution substrate and a semiconductor chip on a top surface of the redistribution substrate. The redistribution substrate may include an under-bump pattern, which includes including a body portion and a protruding portion extended from the body portion to form a single object, an insulating layer covering a side surface of the body portion, and an outer coupling terminal on the protruding portion. The body portion may have a first diameter in a first direction parallel to the top surface of the redistribution substrate, and the protruding portion may have a second diameter in the first direction, which is smaller than the first diameter. A top surface of the protruding portion may be parallel to the first direction, and a side surface of the protruding portion may be inclined at an angle to a top surface of the body portion.

13 Claims, 20 Drawing Sheets

(51) Int. Cl.
  *H01L 23/532* (2006.01)
  *H01L 23/538* (2006.01)
(52) U.S. Cl.
  CPC ............... *H01L 2224/0401* (2013.01); *H01L 2224/12105* (2013.01); *H01L 2224/13024* (2013.01)

(56) References Cited

U.S. PATENT DOCUMENTS

| | | | | |
|---|---|---|---|---|
| 8,458,900 | B2* | 6/2013 | Kodani | H05K 1/116 |
| | | | | 29/852 |
| 9,431,335 | B2 | 8/2016 | Hu | |
| 10,290,605 | B2 | 5/2019 | Jeng et al. | |
| 10,510,631 | B2 | 12/2019 | Tai et al. | |
| 2009/0297879 | A1* | 12/2009 | Zeng | H05K 3/244 |
| | | | | 228/176 |
| 2010/0155116 | A1* | 6/2010 | Kawai | H05K 3/3457 |
| | | | | 174/257 |
| 2018/0286818 | A1 | 10/2018 | Nam | |
| 2019/0122899 | A1 | 4/2019 | Kwon et al. | |
| 2019/0131284 | A1* | 5/2019 | Jeng | H01L 21/563 |
| 2019/0287895 | A1* | 9/2019 | Tajima | H01L 23/53257 |
| 2019/0333837 | A1 | 10/2019 | Kang et al. | |
| 2019/0333849 | A1* | 10/2019 | Furuichi | H01L 21/4853 |
| 2020/0075526 | A1 | 3/2020 | Liu et al. | |

FOREIGN PATENT DOCUMENTS

| | | |
|---|---|---|
| KR | 20180112463 A | 10/2018 |
| TW | 201946238 A | 12/2019 |

* cited by examiner

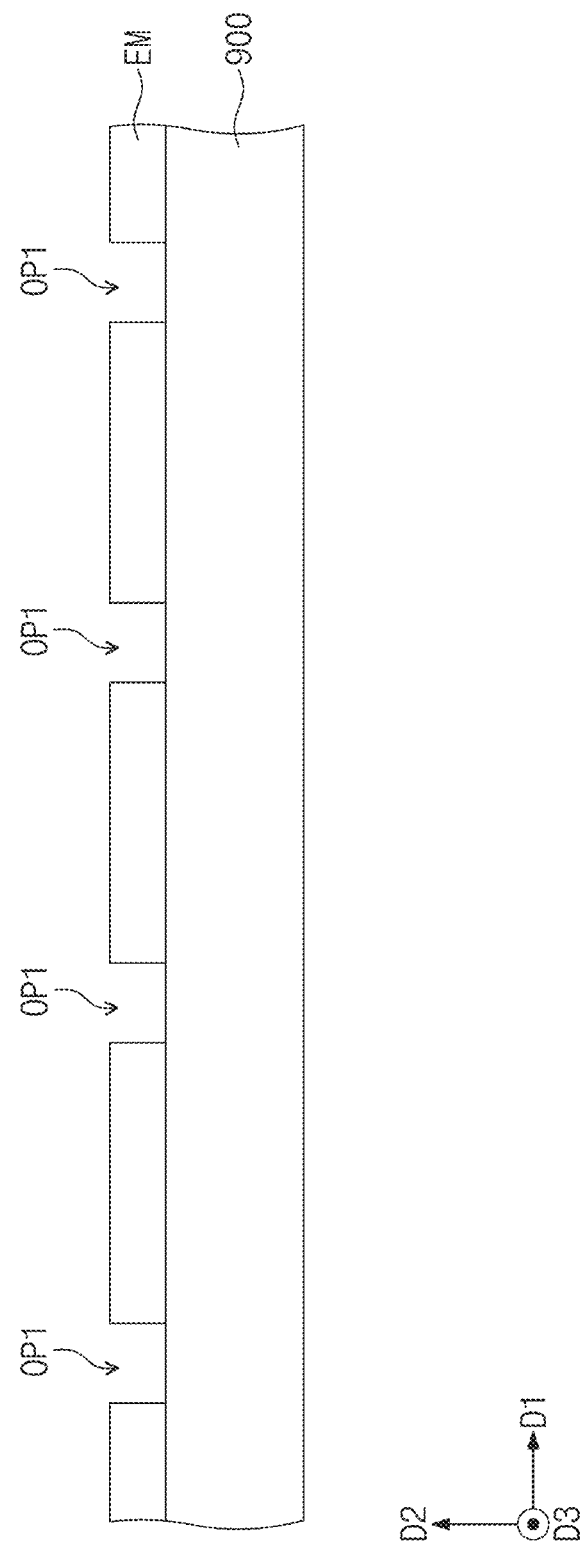

SEMICONDUCTOR PACKAGE DEVICE

CROSS-REFERENCE TO RELATED APPLICATIONS

This U.S. non-provisional patent application claims priority under 35 U.S.C. § 119 to Korean Patent Application No. 10-2020-0087594, filed on Jul. 15, 2020, in the Korean Intellectual Property Office, the entire contents of which are hereby incorporated by reference.

BACKGROUND

The present disclosure relates to a semiconductor package device.

A semiconductor package is configured to easily use an integrated circuit as a part of an electronic product. Conventionally, the semiconductor package includes a printed circuit board (PCB) and a semiconductor chip, which is mounted on the PCB and is electrically connected to the PCB using bonding wires or bumps. With development of the electronic industry, many studies are being conducted to improve the reliability of the semiconductor package and/or to reduce a size of the semiconductor package.

SUMMARY

An embodiment of inventive concepts provides a semiconductor package device with improved reliability.

According to an embodiment of inventive concepts, a semiconductor package device may include a redistribution substrate and a semiconductor chip on a top surface of the redistribution substrate. The redistribution substrate may include an under-bump pattern, an insulating layer, and an outer coupling terminal. The under-bump pattern may include a body portion and a protruding portion, where the protruding portion may extend from the body portion to form a single object along with the body portion. The insulating layer may cover a side surface of the body portion. The outer coupling terminal may be on the protruding portion. The body portion may have a first diameter in a first direction parallel to the top surface of the redistribution substrate, and the protruding portion may have a second diameter in the first direction. The second diameter may be smaller than the first diameter. A top surface of the protruding portion may be parallel to the first direction, and a side surface of the protruding portion may be inclined at an angle to a top surface of the body portion.

According to an embodiment of inventive concepts, a semiconductor package device may include a redistribution substrate and a semiconductor chip on a top surface of the redistribution substrate. The redistribution substrate may include an insulating layer, an under-bump pattern and an outer coupling terminal, the under-bump pattern in the insulating layer and partially exposed to an outside of the insulating layer, and the outer coupling terminal on the under-bump pattern. The under-bump pattern may include a body portion and a protruding portion extending from the body portion. The protruding portion may have a top surface and a side surface, where the top surface of the protruding portion may be spaced apart from the body portion and the side surface of the protruding portion may connect the top surface of the protruding portion to a top surface of the body portion. The side surface of the protruding portion may enclose the top surface of the protruding portion and may have a ring shape, when viewed in a plan view.

According to an embodiment of inventive concepts, a semiconductor package device may include a first semiconductor package and a second semiconductor package on the first semiconductor package. The first semiconductor package may include a lower redistribution substrate, a first semiconductor chip on the lower redistribution substrate, an upper redistribution substrate spaced apart from the first semiconductor chip with the first semiconductor chip between the upper redistribution substrate and the lower redistribution substrate, a connection terminal between the lower redistribution substrate and the first semiconductor chip, and a conductive pillar between the lower redistribution substrate and the upper redistribution substrate. The lower redistribution substrate may include an insulating layer, an under-bump pattern and an outer coupling terminal, the under-bump pattern in the insulating layer and partially exposed to an outside of the insulating layer, and the outer coupling terminal on the under-bump pattern. The under-bump pattern may include a body portion and a protruding portion extending from the body portion. A thickness of the body portion may range from 4 μm to 7 μm, and a thickness of the protruding portion may range from 1 μm to 3 μm. A level of a lowermost surface of the insulating layer may be lower than a level of a lowermost surface of the body portion and the level of a lowermost surface of the insulating layer may be higher than a level of a lowermost surface of the protruding portion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5, 6, 8, 10, and 12 to 16 are sectional views illustrating a process of fabricating the semiconductor package device of FIG. 1.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1:
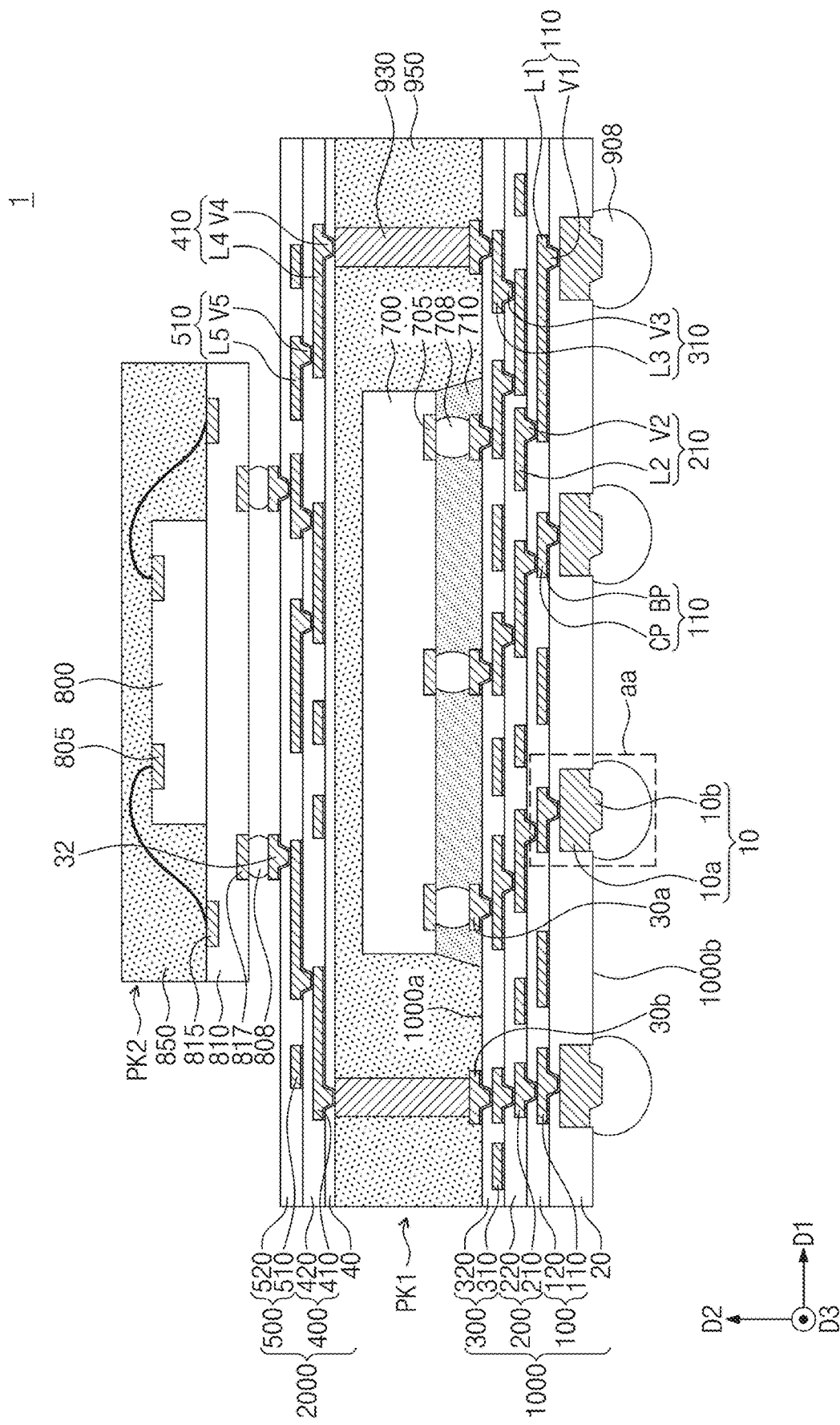
FIG. 1 is a sectional view illustrating a semiconductor package device according to an embodiment of inventive concepts.

FIG. 1 is a sectional view illustrating a semiconductor package device 1 according to an embodiment of inventive concepts.

Referring to FIG. 1, the semiconductor package device 1 may include a first semiconductor package PK1 and a second semiconductor package PK2 on the first semiconductor package PK1. The semiconductor package device 1 may have a package-on-package structure.

The first semiconductor package PK1 may include a lower redistribution substrate 1000, a first semiconductor chip 700, an upper redistribution substrate 2000, a conductive pillar 930, a first molding member 950, and an outer coupling terminal 908.

The lower redistribution substrate 1000 may include a lower insulating layer 20, a first redistribution layer 100, a second redistribution layer 200, and a third redistribution layer 300, which are sequentially stacked. FIG. 1 illustrates an example, in which the lower redistribution substrate 1000 includes three redistribution layers, but inventive concepts is not limited to this example.

The lower redistribution substrate 1000 may have a first surface 1000a and a second surface 1000b, which are opposite to each other. A direction, which is parallel to the first surface 1000a of the lower redistribution substrate 1000, may be defined as a first direction D1. A direction, which is perpendicular to the first surface 1000a of the lower redistribution substrate 1000, may be defined as a second direction D2. A direction, which is parallel to the first surface 1000a of the lower redistribution substrate 1000 and is perpendicular to the first direction D1, may be defined as a third direction D3.

Under-bump patterns 10 may be provided in the lower insulating layer 20. The lower insulating layer 20 may be formed of or include a photo-sensitive insulating material. The photo-sensitive insulating material may be formed of or include at least one of photo-sensitive polyimide, polybenzoxazole, phenol-based polymers, or benzocyclobutene-based polymers. The under-bump pattern 10 will be described in more detail below.

The first redistribution layer 100 may include first redistribution patterns 110 and a first insulating layer 120. The second redistribution layer 200 may include second redistribution patterns 210 and a second insulating layer 220. The third redistribution layer 300 may include third redistribution patterns 310 and a third insulating layer 320.

The first insulating layer 120, the second insulating layer 220, and the third insulating layer 320 may be formed of or include at least one of photo-sensitive polyimide, polybenzoxazole, phenol-based polymers, or benzocyclobutene-based polymers.

In an embodiment, the lower insulating layer 20 and the first to third insulating layers 120, 220, and 320 may be formed of or include the same material, and there may be no observable interface therebetween. In other words, the lower insulating layer 20 and the first to third insulating layers 120, 220, and 320 may be observed as a single insulating layer.

Each of the first to third redistribution patterns 110, 210, and 310 may include a seed/barrier pattern BP and a conductive pattern CP. As an example, the seed/barrier pattern BP may be formed of or include at least one of copper or titanium. The conductive patterns CP may be formed of or include copper.

There may be an observable interface between the seed/barrier pattern BP and the conductive patterns CP. The seed/barrier pattern BP may be locally provided on a bottom surface of the conductive pattern CP. In other words, the seed/barrier pattern BP may not be provided on a side surface of the conductive pattern CP. Thus, the bottom surface of each of the conductive patterns CP may be in contact with the seed/barrier pattern BP, and the side surface of each of the conductive patterns CP may be in contact with the insulating layers 120, 220, and 320.

Each of the first redistribution patterns 110 may include a first via portion V1 and a first interconnection portion L1, which are connected to each other to form a single object. The first via portion V1 may be a portion that penetrates the lower insulating layer 20 and is in contact with a top surface of the under-bump pattern 10. The first interconnection portion L1 may be provided on a top surface of the lower insulating layer 20 and the first via portion V1 and may be connected to the first via portion V1.

Each of the second redistribution patterns 210 may include a second via portion V2 and a second interconnection portion L2, which are connected to each other to form a single object. The second via portion V2 may be a portion that penetrates the first insulating layer 120 and is in contact with a top surface of the first interconnection portion L1 of the first redistribution pattern 110. The second interconnection portion L2 may be provided on a top surface of the first insulating layer 120 and the second via portion V2 and may be connected to the second via portion V2.

Each of the third redistribution patterns 310 may include a third via portion V3 and a third interconnection portion L3, which are connected to each other to form a single object. The third via portion V3 may be a portion that penetrates the second insulating layer 220 and is in contact with a top surface of the second interconnection portion L2 of the second redistribution pattern 210. The third interconnection portion L3 may be provided on a top surface of the second insulating layer 220 and the third via portion V3 and may be connected to the third via portion V3.

The third redistribution patterns 310 may be the topmost redistribution patterns of the redistribution patterns 110, 210, and 310. The first redistribution patterns 110 may be the bottommost redistribution patterns of the redistribution patterns 110, 210, and 310.

First lower bonding pads 30a and second lower bonding pads 30b may be provided on the third redistribution patterns 310. The first lower bonding pads 30a may be in contact with connection terminals 708, which will be described below, and the second lower bonding pads 30b may be in contact with the conductive pillar 930.

The first semiconductor chip 700 may be provided on the lower redistribution substrate 1000. In an embodiment, the first semiconductor chip 700 may be a logic chip. The first semiconductor chip 700 may be disposed on the lower redistribution substrate 1000 such that a first chip pad 705 of the first semiconductor chip 700 faces the lower redistribution substrate 1000.

The connection terminal 708 may be in contact with the first lower bonding pad 30a and the first chip pad 705 and may be electrically connected to the first chip pad 705 and the first lower bonding pad 30a. The first semiconductor chip 700 may be electrically connected to the lower redistribution substrate 1000 through the connection terminal 708. The connection terminal 708 may be formed of or include at least one of solder balls, pillars, or bumps. The connection terminal 708 may be formed of or include at least one of conductive materials (e.g., tin (Sn) or silver (Ag)).

The conductive pillar 930 may be provided on the lower redistribution substrate 1000. The conductive pillar 930 may be provided in the first molding member 950. The conductive pillar 930 may be laterally spaced apart from the first semiconductor chip 700. The conductive pillar 930 may be electrically connected to the outer coupling terminal 908 or the first semiconductor chip 700 through the redistribution patterns 110, 120, and 130. As an example, the conductive pillar 930 may be formed of or include copper.

The first molding member 950 may be formed on the lower redistribution substrate 1000 to cover the lower redistribution substrate 1000. The first molding member 950 may cover the third insulating layer 320 and a side surface of an under fill 710. The first molding member 950 may cover a side surface of the conductive pillar 930 and may expose a top surface of the conductive pillar 930. The first molding member 950 may cover a top surface and both side surfaces of the first semiconductor chip 700.

The outer coupling terminals 908 may be disposed on the lower insulating layer 20. Each of the outer coupling terminals 908 may be, for example, a solder ball. The outer coupling terminals 908 may be arranged in a ball grid array (BGA) shape. The outer coupling terminals 908 may be formed of or include at least one of conductive materials (e.g., tin (Sn) or silver (Ag)).

Each of the outer coupling terminals 908 may be vertically overlapped with a corresponding one of the under-bump patterns 10. The outer coupling terminals 908 may be in contact with the under-bump pattern 10. The outer coupling terminal 908 may be electrically connected to the first chip pad 705 through the under-bump pattern 10 and the redistribution patterns 110, 210, and 310. Thus, it may be unnecessary to align the outer coupling terminal 908 to the first chip pad 705 in a vertical direction. In an embodiment, a plurality of the outer coupling terminals 908 may be provided, and at least one of the outer coupling terminal 908 may not be vertically overlapped with the first semiconductor chip 700. Accordingly, it may be possible to increase a degree of freedom in disposing the outer coupling terminals 908. The first semiconductor package PK1 may be a fan-out semiconductor package, which is fabricated by a chip last process.

The upper redistribution substrate 2000 may be disposed on a top surface of the first molding member 950 and a top surface of the conductive pillar 930.

The upper redistribution substrate 2000 may include an upper insulating layer 40, a fourth redistribution layer 400, and a fifth redistribution layer 500. The upper redistribution substrate 2000 is illustrated to include two redistribution layers 400 and 500, but the upper redistribution substrate 2000 may further include an additional redistribution layer or one of the redistribution layers may be omitted.

The fourth redistribution layer 400 may include fourth redistribution patterns 410 and a fourth insulating layer 420. The fifth redistribution layer 500 may include fifth redistribution patterns 510 and a fifth insulating layer 520. The fifth redistribution layer 500 may be the topmost redistribution layer.

Each of the fourth redistribution patterns 410 may include a fourth via portion V4 and a fourth interconnection portion L4, which are connected to each other to form a single object. The fourth via portion V4 may be a portion that penetrates the upper insulating layer 40 and is in contact with a top surface of the conductive pillar 930. The fourth interconnection portion L4 may be provided on a top surface of the upper insulating layer 40 and the fourth via portion V4 and may be connected to the fourth via portion V4.

Each of the fifth redistribution patterns 510 may include a fifth via portion V5 and a fifth interconnection portion L5, which are connected to each other to form a single object. The fifth via portion V5 may be a portion that penetrates the fourth insulating layer 420 and is in contact with a top surface of the fourth interconnection portion L4 of the fourth redistribution pattern 410. The fifth interconnection portion L5 may be provided on a top surface of the fourth insulating layer 420 and the fifth via portion V5 and may be connected to the fifth via portion V5.

The upper insulating layer 40 and the fourth and fifth insulating layers 420 and 520 may be formed of or include at least one of photo-sensitive polyimide, polybenzoxazole, phenol-based polymers, or benzocyclobutene-based polymers. In an embodiment, the upper insulating layer 40 and the fourth and fifth insulating layers 420 and 520 may be formed of or include the same material, and there may be no observable interface therebetween. In other words, the upper insulating layer 40, the fourth insulating layer 420, and the fifth insulating layer 520 may be observed as a single insulating layer.

An upper bonding pad 32 may be provided on the fifth redistribution layer 500. The upper bonding pad 32 may be in contact with the fifth interconnection portion L5 of the fifth redistribution pattern 510 and may be in contact with a package coupling terminal 808, which will be described below.

The second semiconductor package PK2 may be provided on the upper redistribution substrate 2000. The second semiconductor package PK2 may include a package substrate 810, a second semiconductor chip 800, and a second molding member 850. The package substrate 810 may be a printed circuit board or a redistribution substrate. Metal pads 815 and 817 may be respectively provided on opposite surfaces of the package substrate 810.

In an embodiment, the second semiconductor chip 800 may be a memory chip, such as a DRAM chip or a NAND FLASH memory chip. The second semiconductor chip 800 may be of a different kind from the first semiconductor chip 700. A second chip pad 805, which is disposed on a surface of the second semiconductor chip 800, may be connected to the metal pad 815 of the package substrate 810 in a wire bonding manner.

The package coupling terminal 808 may be disposed between the first semiconductor package PK1 and the second semiconductor package PK2. The package coupling terminal 808 may be in contact with the upper bonding pad 32 and metal pad 817. The package coupling terminal 808 may be electrically connected to the upper bonding pad 32 and metal pad 817. Thus, the second semiconductor package PK2 may be electrically connected to the first semiconductor chip 700 and the outer coupling terminal 908 through the upper redistribution substrate 2000, the package coupling terminal 808, and the conductive pillar 930.

Figure 2:
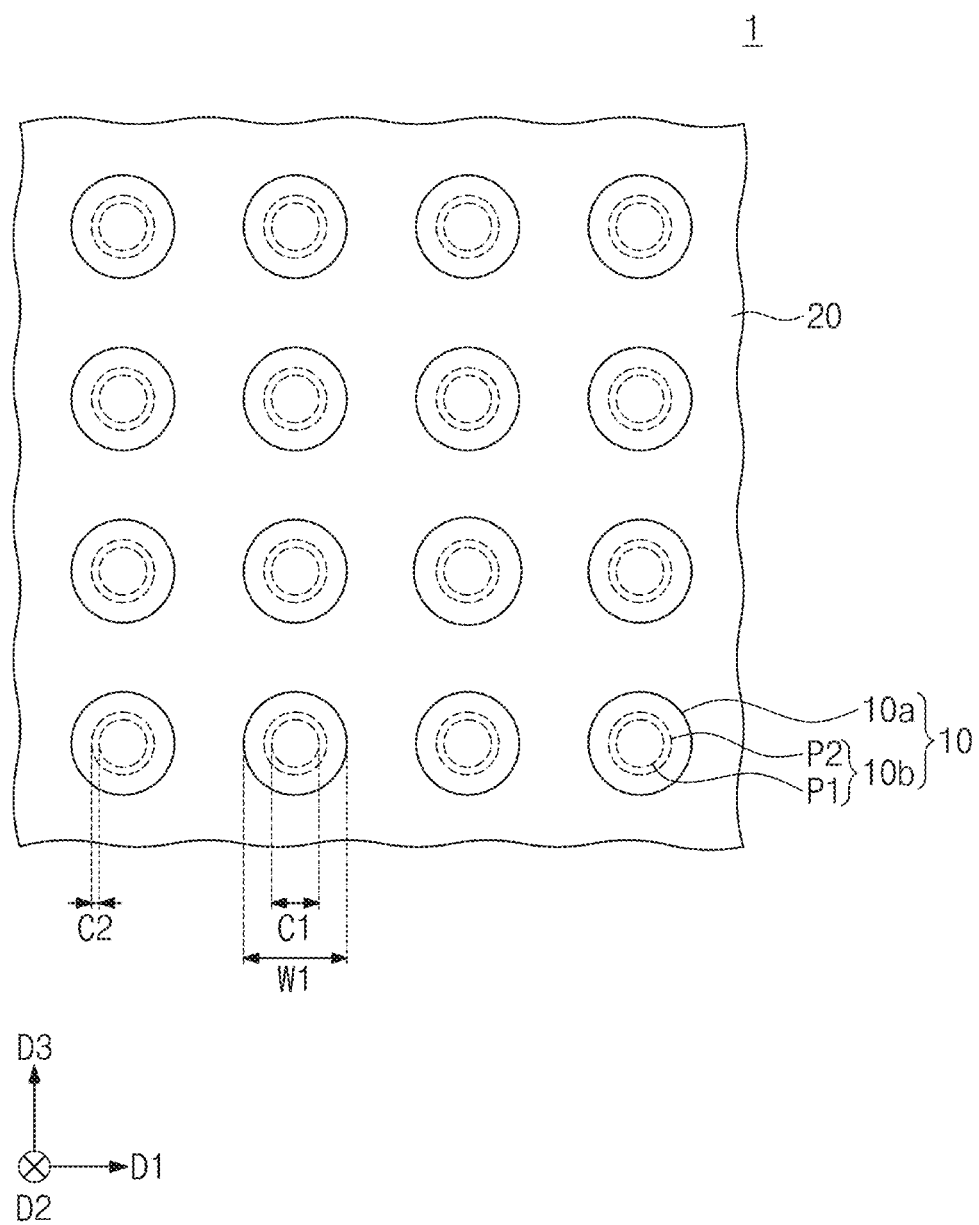
FIG. 2 is a bottom plan view illustrating the semiconductor package device of FIG. 1.

FIG. 2 is a bottom plan view illustrating the semiconductor package device of FIG. 1. In order to reduce complexity in the drawings and to provide better understanding of this embodiment, the outer coupling terminal 908 of FIG. 1 may be omitted from FIG. 2. FIGS. 3A, 3B, 4A, and 4B are enlarged views illustrating a portion 'aa' of FIG. 1, according to an embodiment of inventive concepts.

Hereinafter, the under-bump pattern 10 and elements disposed near the same will be described in more detail.

Figure 3A:
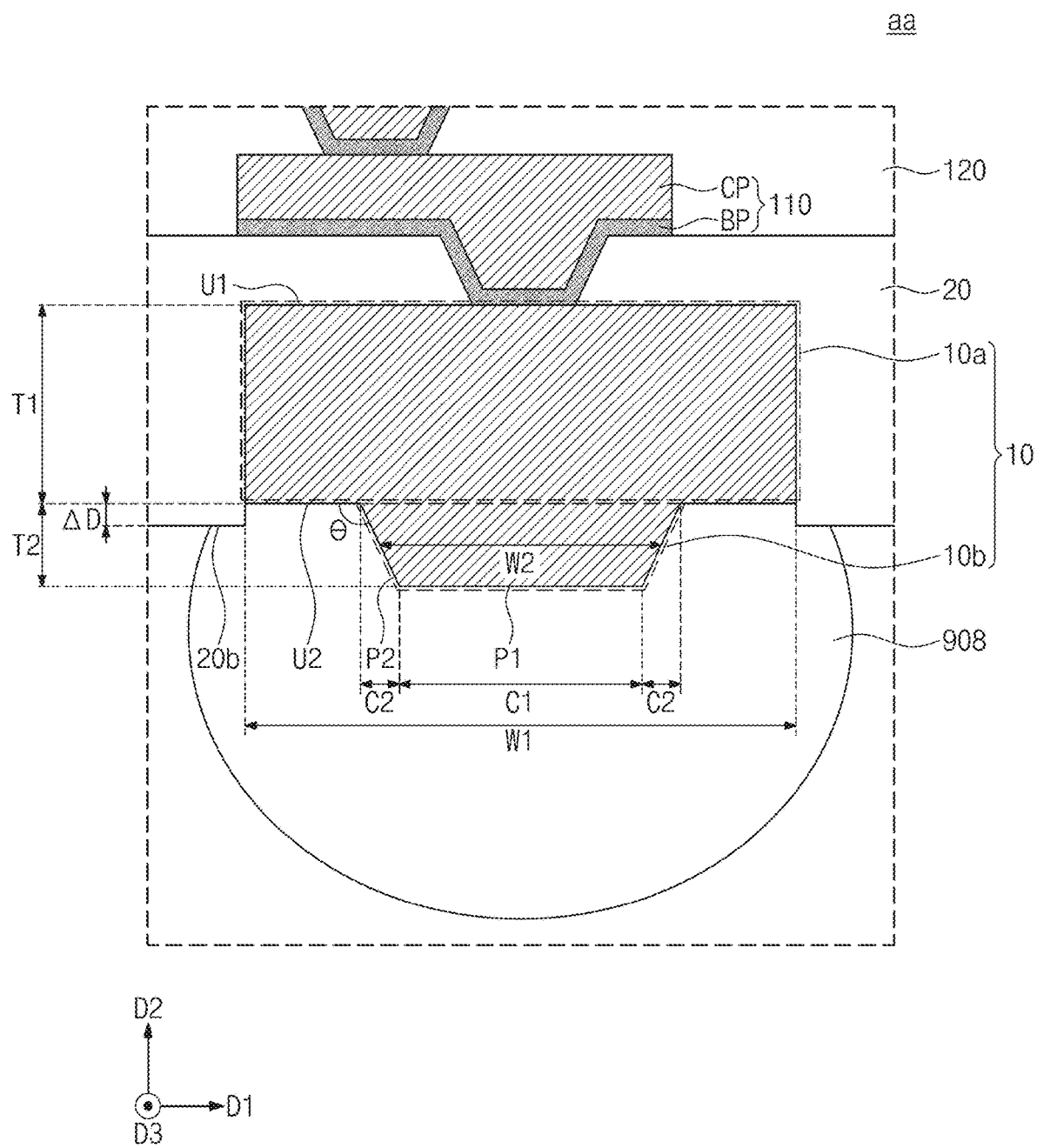
FIGS. 3A, 3B, 4A, and 4B are enlarged views illustrating a portion 'aa' of FIG. 1, according to an embodiment of inventive concepts.

Referring to FIGS. 2 and 3A, the under-bump patterns 10 may be two-dimensionally disposed in the first and third directions D1 and D3. In an embodiment, the under-bump pattern 10 may be formed of or include copper.

The under-bump pattern 10 may include a body portion 10a and a protruding portion 10b, which is extended from the body portion 10a and constitutes a single object along with the body portion 10a. There may be no observable interface between the body portion 10a and the protruding portion 10b.

The body portion 10a may have a cylinder shape or a cylinder-like shape. The body portion 10a may have a rectangular shape or a rectangular-like shape, when viewed in a section.

The body portion 10a may include a first surface U1 and a second surface U2, which are opposite to each other. At least a portion of the first surface U1 of the body portion 10a may be in contact with the first redistribution pattern 110, and the remaining portion may be covered with the lower insulating layer 20. In detail, the first surface U1 of the body portion 10a may be in contact with the seed/barrier pattern BP of the first redistribution pattern 110. The second surface U2 of the body portion 10a may be exposed from the lower insulating layer 20. A side surface of the body portion 10a connecting the first surface U1 to the second surface U2 may be covered with the lower insulating layer 20.

The first and second surfaces U1 and U2 of the body portion 10a may have substantially the same shape and area. The first surface U1 and the second surface U2 of the body portion 10a may have a circle shape or a circle-like shape, when viewed in a plan view.

The protruding portion 10b may be provided on the second surface U2 of the body portion 10a. The protruding portion 10b may be disposed on a center portion of the second surface U2 of the body portion 10a. The protruding portion 10b may be vertically overlapped with the body portion 10a. Due to the protruding portion 10b, only a portion of the second surface U2 of the body portion 10a may be exposed. The exposed portion of the second surface U2 of the body portion 10a may be in contact with the outer coupling terminal 908.

The protruding portion 10b may have a cylinder shape or a cylinder-like shape. When viewed in a sectional view, the protruding portion 10b may have a trapezoid shape or a trapezoid-like shape. The protruding portion 10b may have a top surface P1 and a side surface P2. The top surface P1 of the protruding portion 10b may be spaced apart from the second surface U2 of the body portion 10a in the second direction D2. When viewed in a plan view, the top surface P1 of the protruding portion 10b may have a circle shape or a circle-like shape.

The side surface P2 of the protruding portion 10b may connect the top surface P1 of the protruding portion 10b to the second surface U2 of the body portion 10a. When viewed in a plan view, the side surface P2 of the protruding portion 10b may have a ring shape or a ring-like shape and may enclose the top surface P1 of the protruding portion 10b. The side surface P2 may be inclined at an angle to each of the first and second directions D1 and D2. In the present specification, the expression "an element A is inclined at an angle to another element B" may mean that an angle between the elements A and B is not the right angle (e.g., 90°).

As an example, the side surface P2 may be inclined at an angle Θ of 120° to 150° to the second surface U2 of the body portion 10a. As an example, the angle Θ may be 135°. The top and side surfaces P1 and P2 of the protruding portion 10b may be in contact with the outer coupling terminal 908.

The body portion 10a may have a first diameter W1 in the first direction D1. The first diameter W1 may be substantially unchanged in the second direction D2.

The protruding portion 10b may have a second diameter W2 in the first direction D1. The second diameter W2 may increase in the second direction D2. In other words, the second diameter W2 may have the smallest value at a level of the top surface P1 in contact with the outer coupling terminal 908 and may have the largest value at a level of a surface of the protruding portion 10b in contact with the body portion 10a.

The first diameter W1 may be greater than the second diameter W2. The second diameter W2 may be larger than half of the first diameter W1. The first diameter W1 may range from 40 μm to 60 μm. In an embodiment, the first diameter W1 may be 50 μm, and the second diameter W2 may range from 20 μm to 50 μm.

Referring to the plan view of FIG. 2, the top surface P1 of the protruding portion 10b may have a third diameter C1 in the first direction D1, and the side surface P2 of the protruding portion 10b may have a width C2 in the first direction D1. The width C2 may be smaller than the third diameter C1. As an example, the third diameter C1 may be 25 μm.

Each of the body portion 10a and the protruding portion 10b may have thicknesses T1 and T2 in the second direction D2. The thickness T1 of the body portion 10a may be greater than the thickness T2 of the protruding portion 10b. The thickness T1 of the body portion 10a may range from 4 μm to 7 μm, and the thickness T2 of the protruding portion 10b may range from 1 μm to 3 μm. As an example, the thickness of the body portion 10a may be 5 μm, and the thickness of the protruding portion 10b may be 2 μm.

A level of the lowermost surface 20b of the lower insulating layer 20 may be lower than a level of the second surface U2 of the body portion 10a and may be higher than a level of the top surface P1 of the protruding portion 10b. In other words, the lowermost surface 20b of the lower insulating layer 20 may be positioned between the second surface U2 of the body portion 10a and the top surface P1 of the protruding portion 10b. A vertical distance ΔD between the lowermost surface 20b of the lower insulating layer 20 and the second surface U2 of the body portion 10a may range from 0.15 μm to 0.35 μm (from 1500 Å to 3500 Å).

In addition, a first intermetallic compound layer (not shown) may be provided between the outer coupling terminal 908 and the under-bump pattern 10. The first intermetallic compound layer will be described in more detail with reference to FIG. 3B.

Figure 3B:
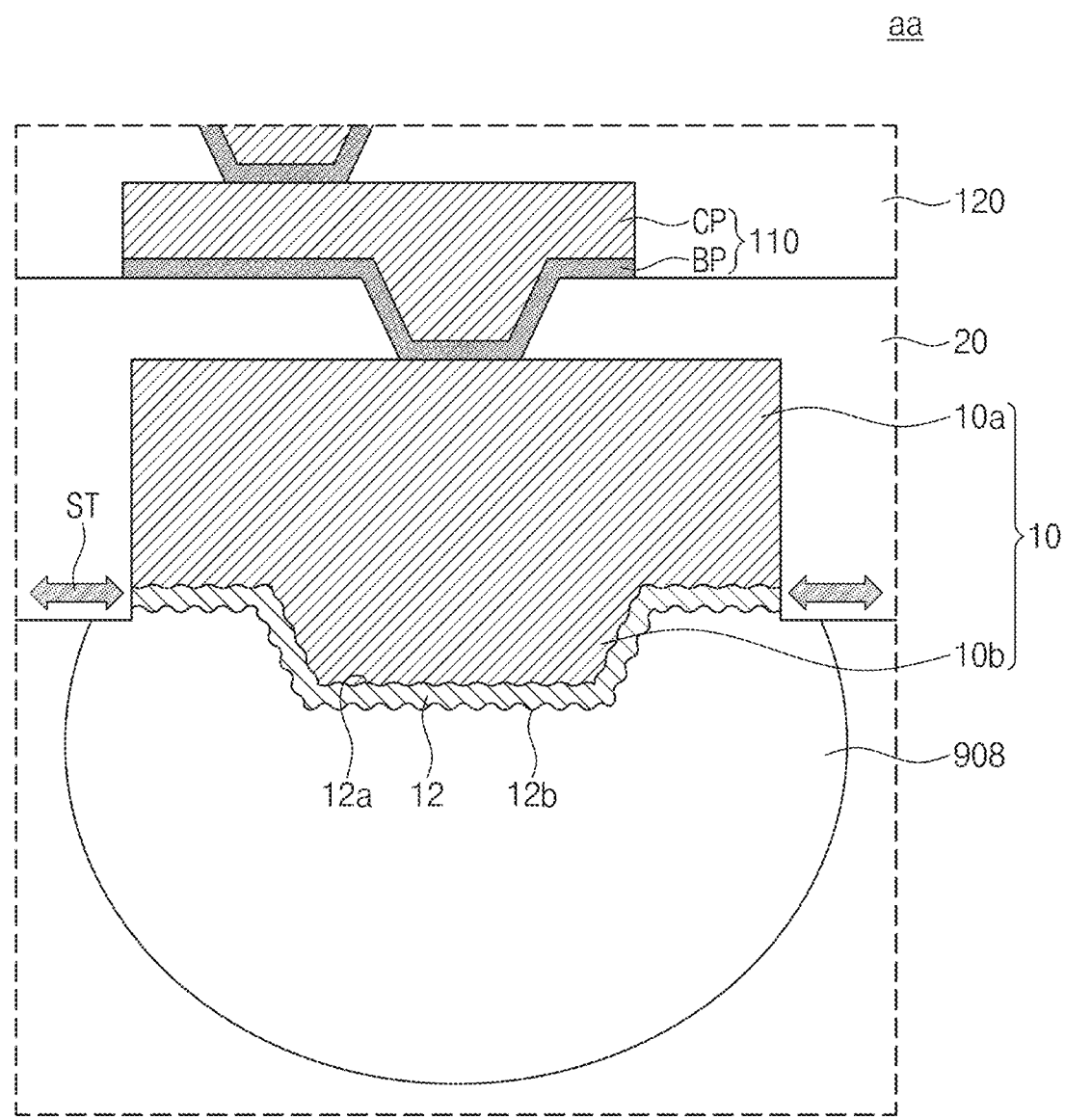

In certain embodiments, referring to FIG. 3B, a first intermetallic compound layer 12 may be interposed between the under-bump pattern 10 and the outer coupling terminal 908. The first intermetallic compound layer 12 may be formed as a result of diffusion of a material constituting the outer coupling terminal 908 and/or the under-bump pattern 10. In particular, the first intermetallic compound layer 12 may be formed when the outer coupling terminal 908 is attached to the under-bump pattern 10 by a thermal treatment process, as will be described with reference to FIG. 16. The first intermetallic compound layer 12 may be formed of or include at least one of copper-tin compounds (e.g., $Cu_3Sn$ and $Cu_6Sn_5$). The copper-tin compound may have relatively low ductility and relatively high hardness, compared with copper. A first interface 12a between the first intermetallic compound layer 12 and the under-bump pattern 10 may be formed to have an uneven profile, and a second interface 12b between the first intermetallic compound layer 12 and the outer coupling terminal 908 may be formed to have an uneven profile. This may be because the first intermetallic compound layer 12 is formed by the diffusion. Since a diffusion speed of copper is higher than a diffusion speed of tin, the uneven portion in the second interface 12b may have a width that is larger than that in the first interface 12a.

In the case where pressure is exerted in a sawing process, which will be described below, or in other subsequent processes, a stress ST in the first direction D1 may be exerted on the outer coupling terminal 908 and the under-bump pattern 10. In this case, a crack may be produced near the first intermetallic compound layer 12 and along the first direction D1. The crack may have a crack propagation path that is substantially parallel to the first direction D1. In the case where the crack is propagated to a certain distance along the crack propagation path, the first intermetallic compound layer 12 and the outer coupling terminal 908 may be separated from the under-bump pattern 10 or the outer coupling terminal 908 may be separated from the first intermetallic compound layer 12.

According to an embodiment of inventive concepts, since the under-bump pattern 10 includes the protruding portion 10b, a length of the first intermetallic compound layer 12 may be increased, compared with the case in which the under-bump pattern 10 has only the body portion 10a. As a result, since the crack propagation path near the outer coupling terminal 908 is increased, it may be possible to reduce risk of the separation of the outer coupling terminal 908. In addition, since copper with relatively high ductility is located on the crack propagation path along the first direction D1, it may be possible to limit and/or prevent the crack from propagating.

Figure 16:
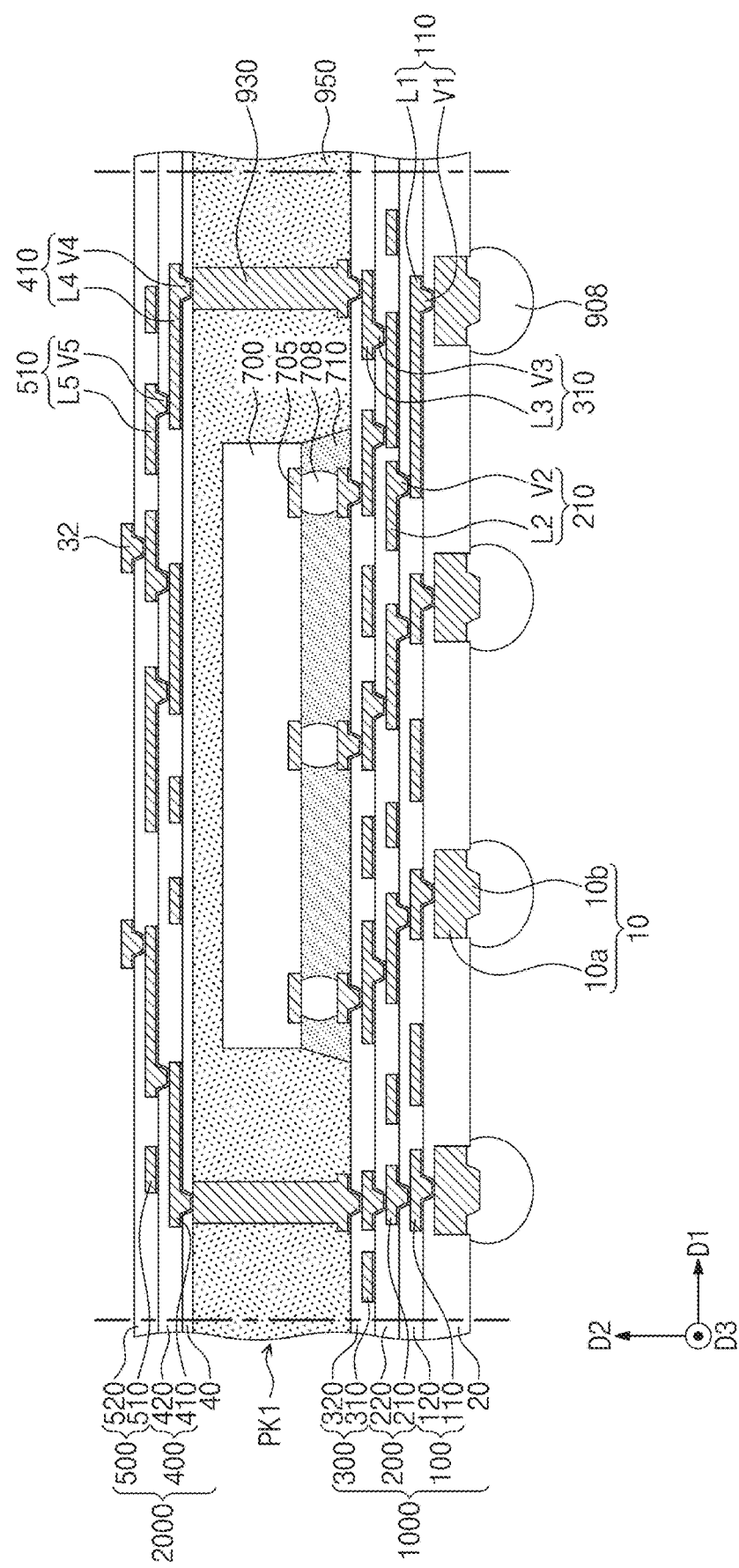

Since the under-bump pattern 10 includes the protruding portion 10b, a contact area between the under-bump pattern 10 and the outer coupling terminal 908 may be increased, in a process of attaching the outer coupling terminal 908 of FIG. 16, when compared with the case in which the under-bump pattern 10 includes only the body portion 10a. By virtue of this increase of the contact area, the outer coupling terminal 908 may be more effectively attached to the under-bump pattern 10. When the outer coupling terminal 908 is attached to the under-bump pattern 10, the inclined side surface P2 of the protruding portion 10b of the under-bump pattern 10 may suppress an abrupt change in height between the body portion 10a and the protruding portion 10b, compared with the case, in which the side surface is vertically extended, and thus, the outer coupling terminals 908 may be more efficiently aligned to the under-bump pattern 10 and a void issue may be reduced.

In other words, according to an embodiment of inventive concepts, since the under-bump pattern 10 includes the protruding portion 10b and the protruding portion 10b has the inclined side surface P2, it may be possible to improve reliability in a process of attaching the outer coupling terminals 908 and in subsequent processes.

Figure 4A:
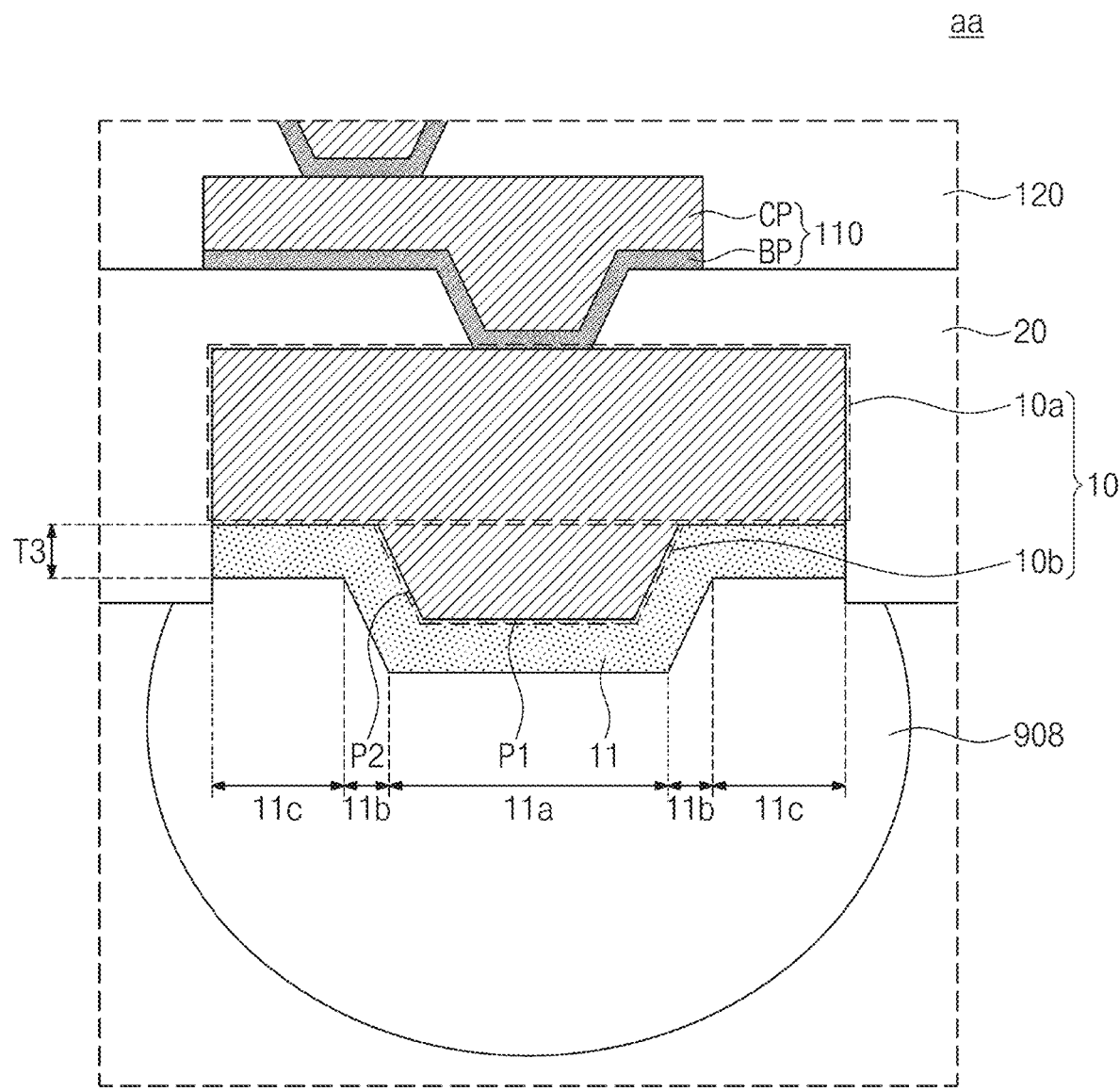

Referring to FIG. 4A, a diffusion prevention pattern 11 may be interposed between the under-bump pattern 10 and the outer coupling terminal 908. The diffusion prevention pattern 11 may be in contact with the under-bump pattern 10 and the outer coupling terminal 908. The diffusion prevention pattern 11 may be formed of or include a metal material different from the under-bump pattern 10. As an example, the diffusion prevention pattern 11 may be formed of or include nickel. The diffusion prevention pattern 11 may serve as a diffusion barrier layer for limiting and/or preventing a material of the outer coupling terminal 908 from being diffused into the under-bump pattern 10.

A thickness T3 of the diffusion prevention pattern 11 may be smaller than the thickness T1 of the body portion 10a of the under-bump pattern 10 of FIG. 3A and the thickness T2 of the protruding portion 10b. The thickness T3 of the diffusion prevention pattern 11 may range from 0 μm to 3 μm. As an example, the thickness T3 of the diffusion prevention pattern 11 may be 2 μm. In the case where the diffusion prevention pattern 11 is provided, the under-bump pattern 10 may not be in contact with the outer coupling terminal 908.

The diffusion prevention pattern 11 may include a first portion 11a, a second portion 11b, and a third portion 11c, which are sequentially connected to each other. The first and third portions 11a and 11c may be connected to each other by the second portion 11b. The first portion 11a may be a portion of the diffusion prevention pattern 11 that covers the top surface P1 of the protruding portion 10b of the under-bump pattern 10. The second portion 11b may be the diffusion prevention pattern 11 that covers the side surface P2 of the protruding portion 10b of the under-bump pattern 10. The third portion 11c may be a portion of the diffusion prevention pattern 11 covering the second surface U2 of the body portion 10a that is not covered with the protruding portion 10b.

The first and third portions 11a and 11c of the diffusion prevention pattern 11 may be extended in the first direction D1. The second portion 11b of the diffusion prevention pattern 11 may be extended to be at an angle to the first and second directions D1 and D2.

Figure 4B:
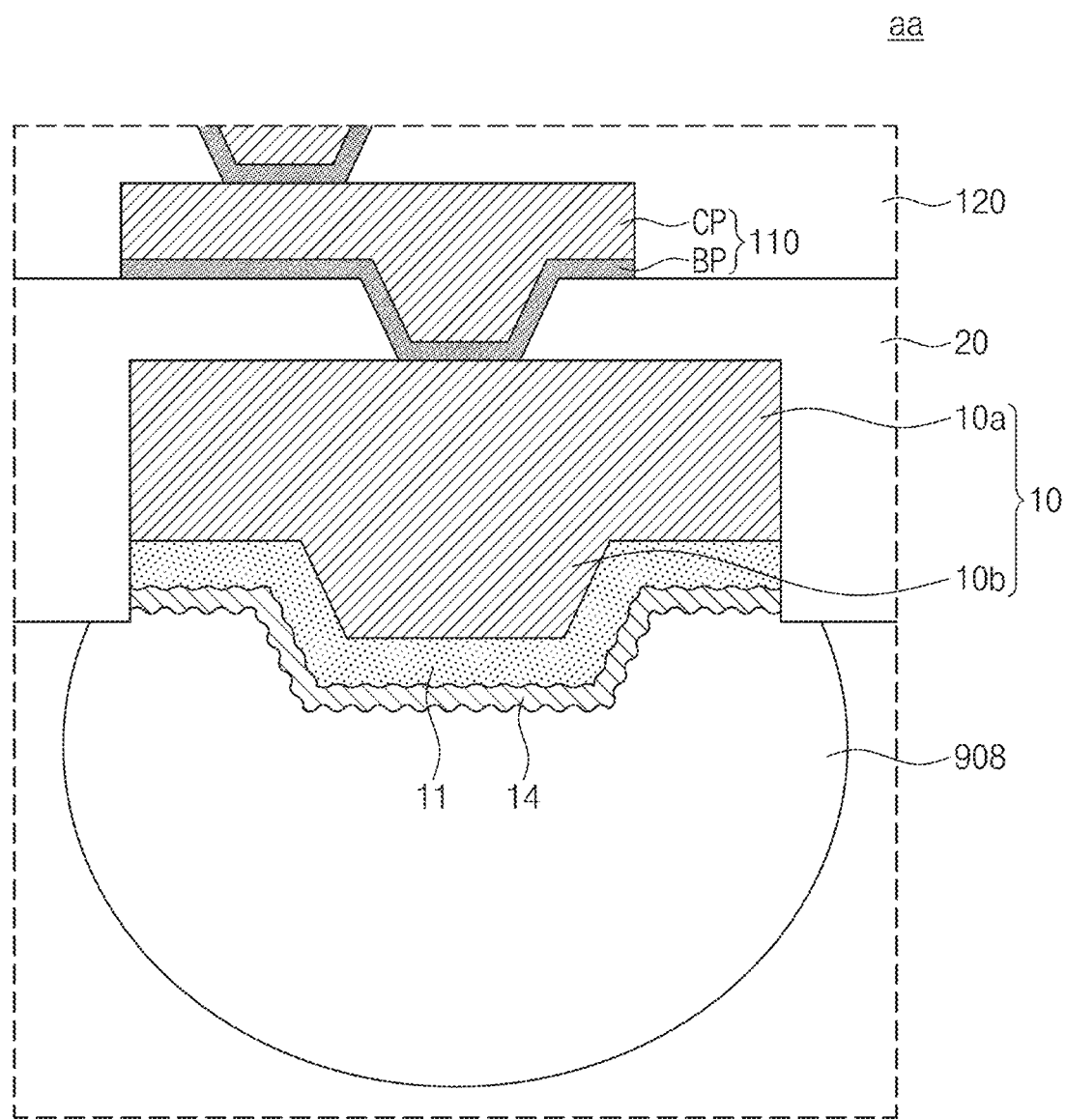

In certain embodiments, referring to FIG. 4B, a second intermetallic compound layer 14 may be interposed between the diffusion prevention pattern 11 and the outer coupling terminal 908. The second intermetallic compound layer 14 may be formed as a result of diffusion of a material constituting the outer coupling terminal 908 and/or the diffusion prevention pattern 11. The second intermetallic compound layer 14 may be formed of or include a nickel-tin compound (e.g., $Ni_3Sn_4$). The nickel-tin compound may have relatively low ductility and relatively high hardness, compared with copper.

FIGS. 5, 6, 8, 10, and 12 to 16 are sectional views illustrating a process of fabricating the semiconductor package device of FIG. 1. For concise description, an element previously described with reference to FIG. 1 may be identified by the same reference number without repeating an overlapping description thereof.

Referring to FIG. 5, a carrier substrate 900 may be provided. The carrier substrate 900 may be a glass substrate. The carrier substrate 900 may be transparent.

An etch mask EM may be formed on the carrier substrate 900. The etch mask EM may include a plurality of first openings OP1. Portions of a top surface of the carrier substrate 900 may be exposed by the first openings OP1. The etch mask EM may be formed by forming, exposing, and developing a photoresist layer.

Figure 6:
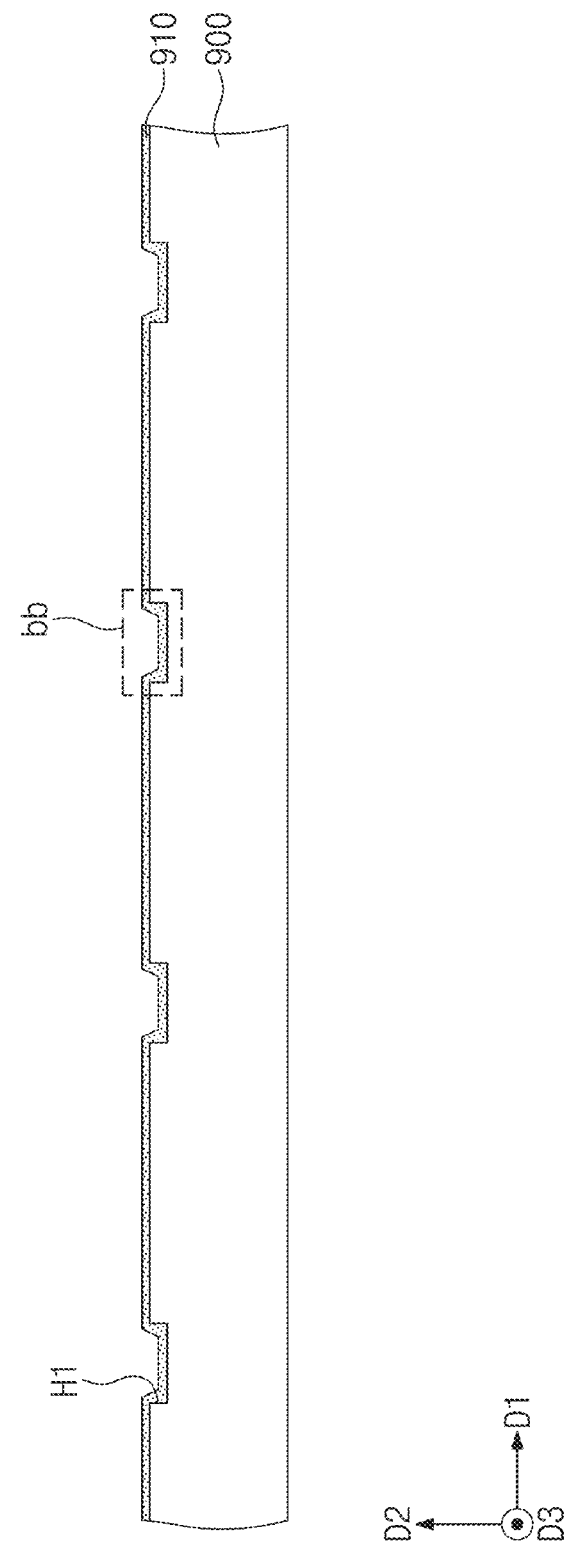

Referring to FIG. 6, a plurality of holes H1 may be formed through an etching process. The etching process may be performed by one of a dry etching process or a wet etching process. Etchants may be supplied through the first openings OP1 of the etch mask EM of FIG. 5 to etch the exposed portions of the top surface of the carrier substrate 900. The etch mask EM may be removed after the etching process. Next, an adhesive layer 910 may be formed to cover the top surface of the carrier substrate 900. In an embodiment, the formation of the adhesive layer 910 may include a process of attaching an adhesive tape under a high temperature condition.

Figure 7:
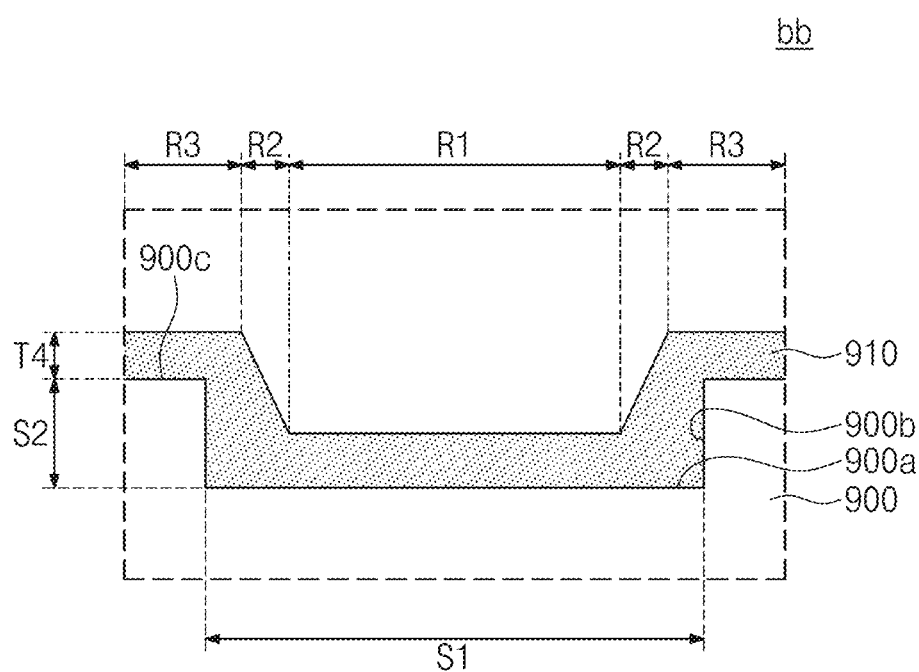
FIG. 7 is an enlarged view illustrating a portion 'bb' of FIG. 6.

FIG. 7 is an enlarged view illustrating a portion 'bb' of FIG. 6. Referring to FIGS. 6 and 7, bottom and inner side surfaces 900a and 900b of the carrier substrate 900 defining a hole H1 may form substantially a right angle. The cross-section of the carrier substrate 900 may have an inclined or rounded shape, according to condition of its etching process. A diameter S1 of the hole H1 in the first direction D1 may range from 20 µm to 40 µm. A depth S2 of the hole H1 in the second direction D2 may range from 2 µm to 5 µm. A ratio of the diameter S1 of the hole H1 to the depth S2 of the hole H1 may range from 5:1 to 15:1.

The adhesive tape may be provided in the form of a sheet. The adhesive tape may be formed of or include a polymer material, which has an adhesive property at a high temperature. The adhesive tape may be attached to the bottom surface 900a, the inner side surface 900b, and the uppermost surface 900c of the carrier substrate 900. The adhesive tape, which is attached to the inner side surface 900b of the carrier substrate 900, may connect the uppermost surface 900c to the bottom surface 900a and may have an inclined angle therebetween. This may be because the adhesive tape provided in the form of a sheet can be bent between the uppermost surface 900c and the bottom surface 900a located at different levels, when it is used to connect them to each other.

The adhesive layer 910 may have fluidic and adhesive properties. The adhesive layer 910 formed may include a first portion R1, a second portion R2, and a third portion R3, which are connected to each other. The first portion R1 may cover the bottom surface 900a of the carrier substrate 900, and the second portion R2 may cover the inner side surface 900b. The third portion R3 may cover the uppermost surface 900c of the carrier substrate 900 outside the hole H1. The first portion R1 and the third portion R3 may be extended in the first direction D1. The second portion R2 may connect the first portion R1 and the third portion R3 to each other. The first portion R1 and the third portion R3 may have a thickness T4 ranging from 0 µm to 2 µm.

Figure 8:
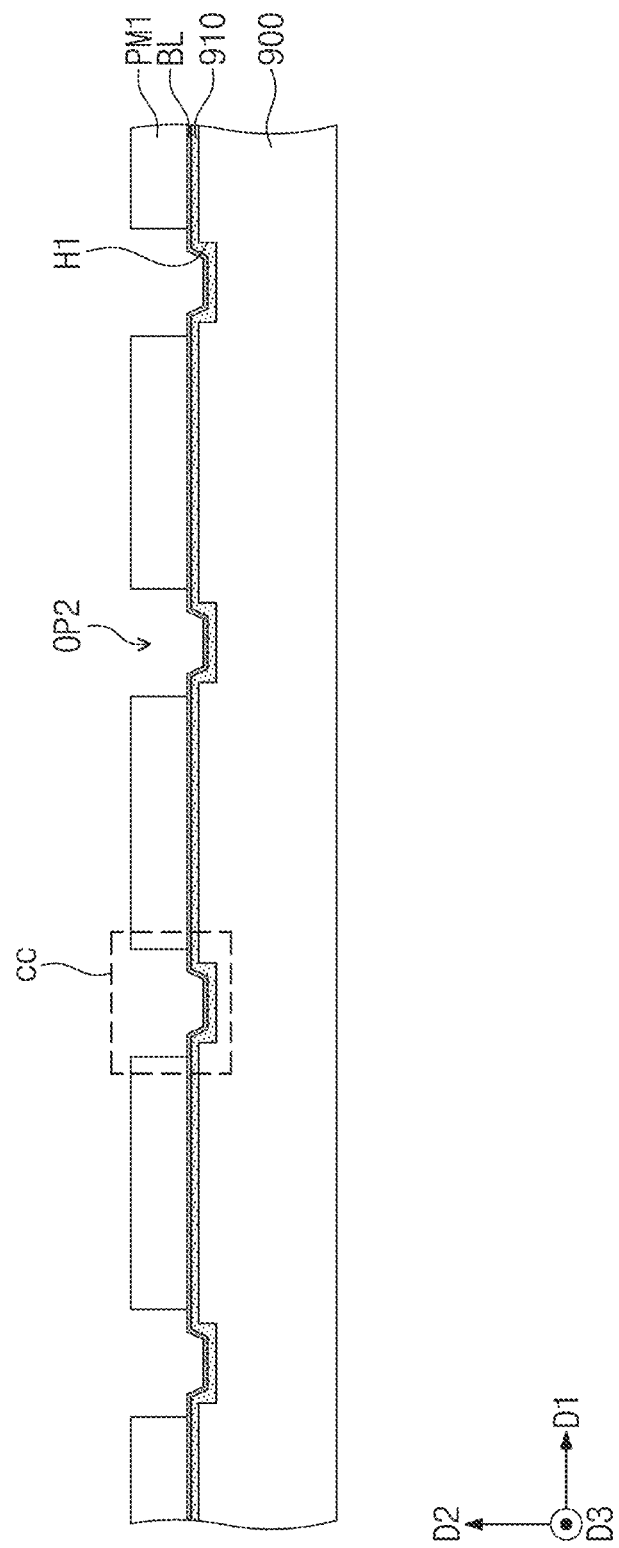
Figure 9:
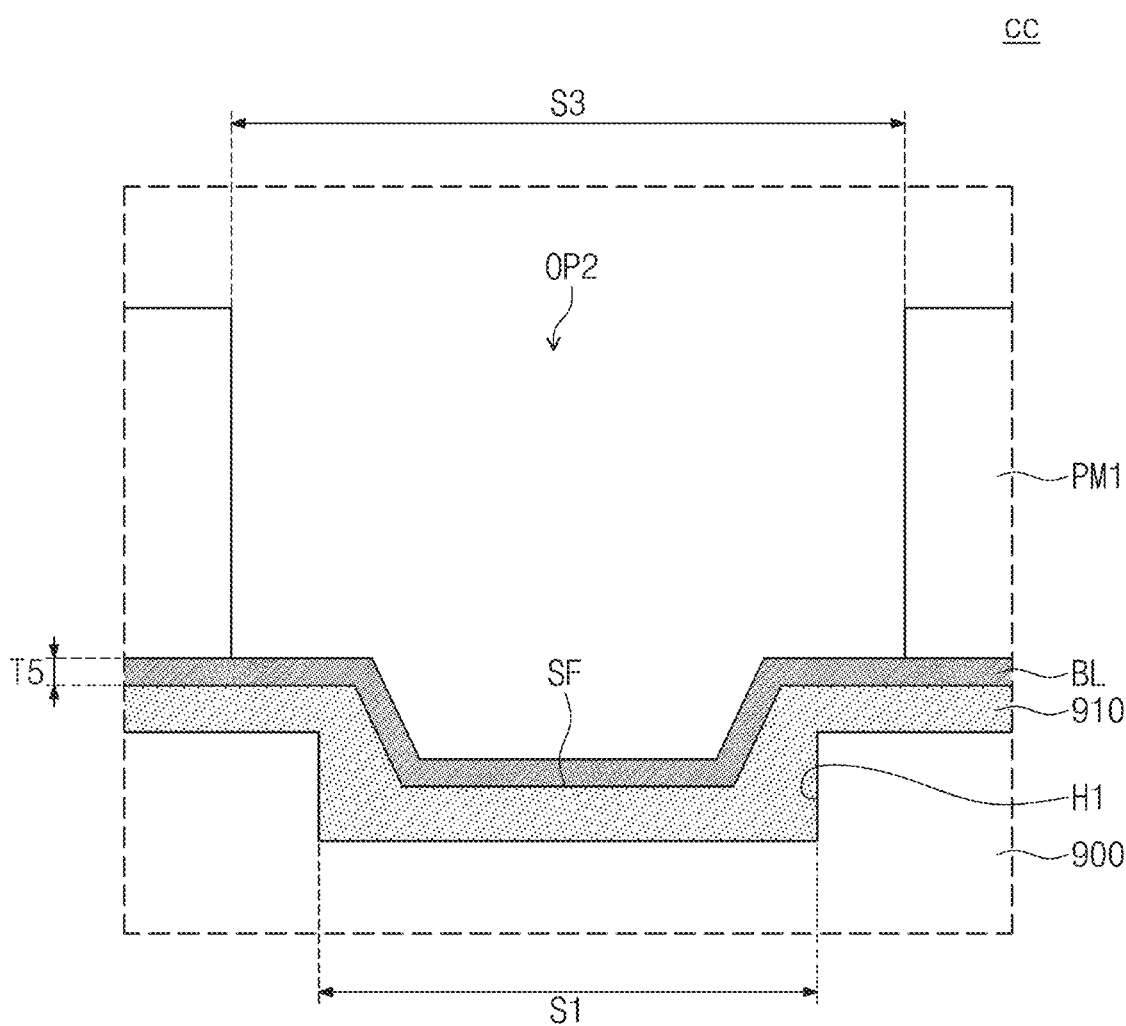
FIG. 9 is an enlarged view illustrating a portion 'cc' of FIG. 8.

FIG. 9 is an enlarged view illustrating a portion 'cc' of FIG. 8. Referring to FIGS. 8 and 9, a seed/barrier layer BL may be formed on the adhesive layer 910 to cover a top surface of the adhesive layer 910. The seed/barrier layer BL may have a shape, to which a surface SF of the adhesive layer 910 is transferred. In an embodiment, the seed/barrier layer BL may be formed of or include at least one of copper and titanium. A thickness T5 of the seed/barrier layer BL may range from 0.15 µm to 0.35 µm (from 1500 Å to 3500 Å). The seed/barrier layer BL may be formed by a deposition process (e.g., a chemical vapor deposition process and a physical vapor deposition process). The adhesive layer 910 may attach the seed/barrier layer BL to the carrier substrate 900.

A first photomask pattern PM1 may be formed on a top surface of the seed/barrier layer BL. The first photomask pattern PM1 may be formed by forming, exposing, and developing a photoresist layer. The first photomask pattern PM1 may include a second opening OP2 defining a region, in which the under-bump pattern 10 is formed. The seed/barrier layer BL may be exposed through the second opening OP2. The second opening OP2 may be vertically overlapped with the hole H1.

The second opening OP2 may have a diameter S3 in the first direction D1. The diameter S3 of the second opening OP2 may correspond to the diameter W1 of the body portion 10a of FIG. 3A. The diameter S3 of the second opening OP2 may be greater than the diameter S1 of the hole H1.

Figure 10:
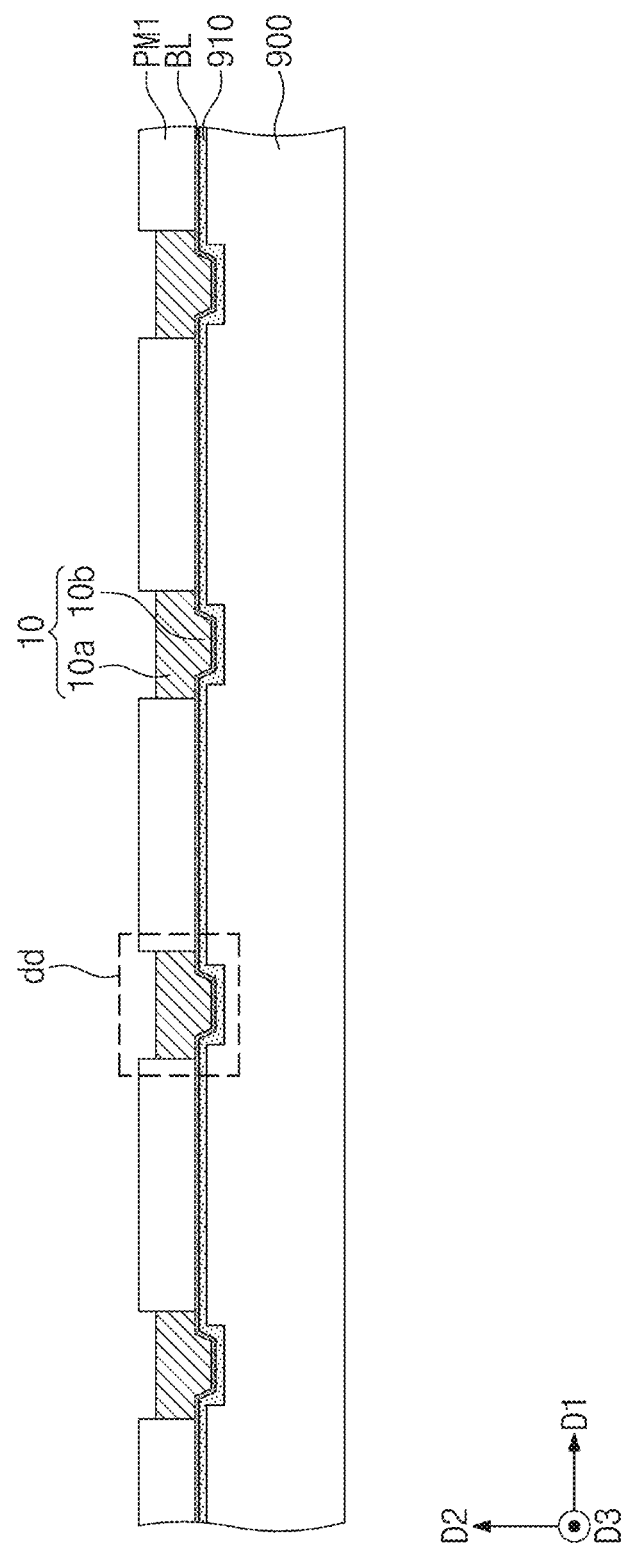
Figure 11:
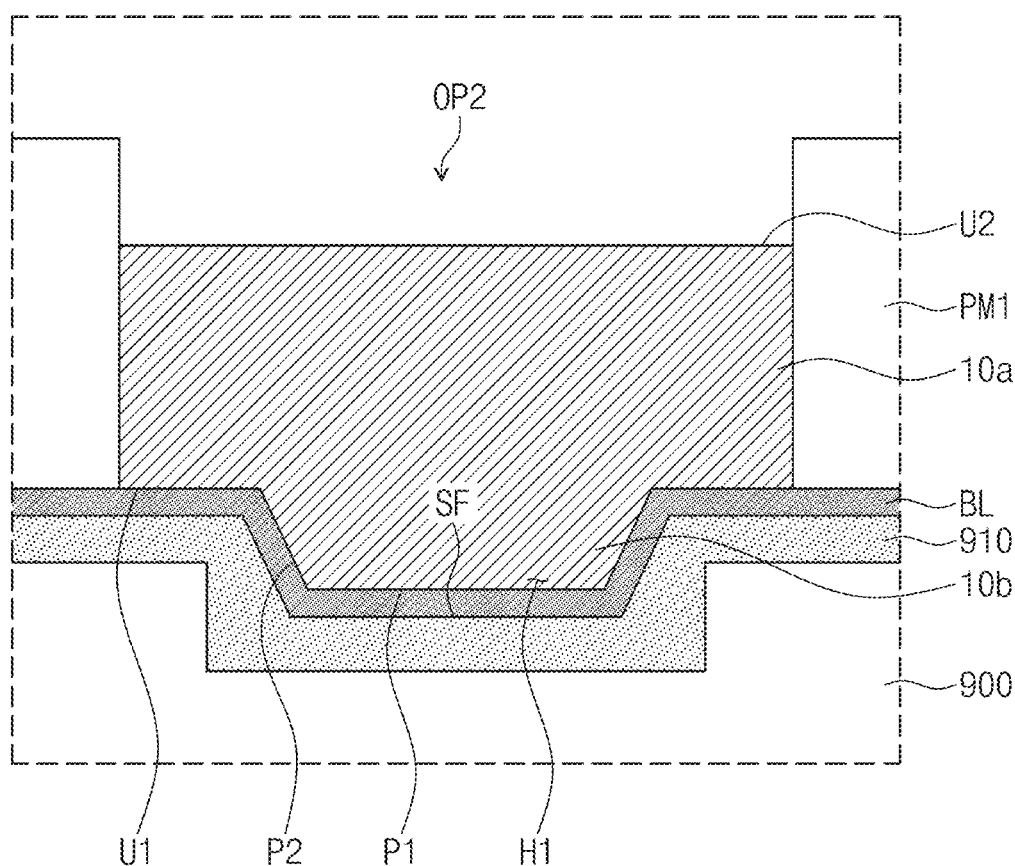
FIG. 11 is an enlarged view illustrating a portion 'dd' of FIG. 10.

FIG. 11 is an enlarged view illustrating a portion 'dd' of FIG. 10. Referring to FIGS. 10 and 11, the under-bump pattern 10 may be formed by an electroplating process, in which the seed/barrier layer BL in the second opening OP2 and the hole H1 of FIG. 9 is used as an electrode. The protruding portion 10b of the under-bump pattern 10 may fill the hole H1, and the body portion 10a may fill the second opening OP2. The side surface P2 of the protruding portion 10b of the under-bump pattern 10 may have an inclined surface, like the second portion R2 of the adhesive layer 910.

In an embodiment, the diffusion prevention pattern 11 of FIG. 4A may be formed by an electroplating process, before the formation of the under-bump pattern 10.

Figure 12:
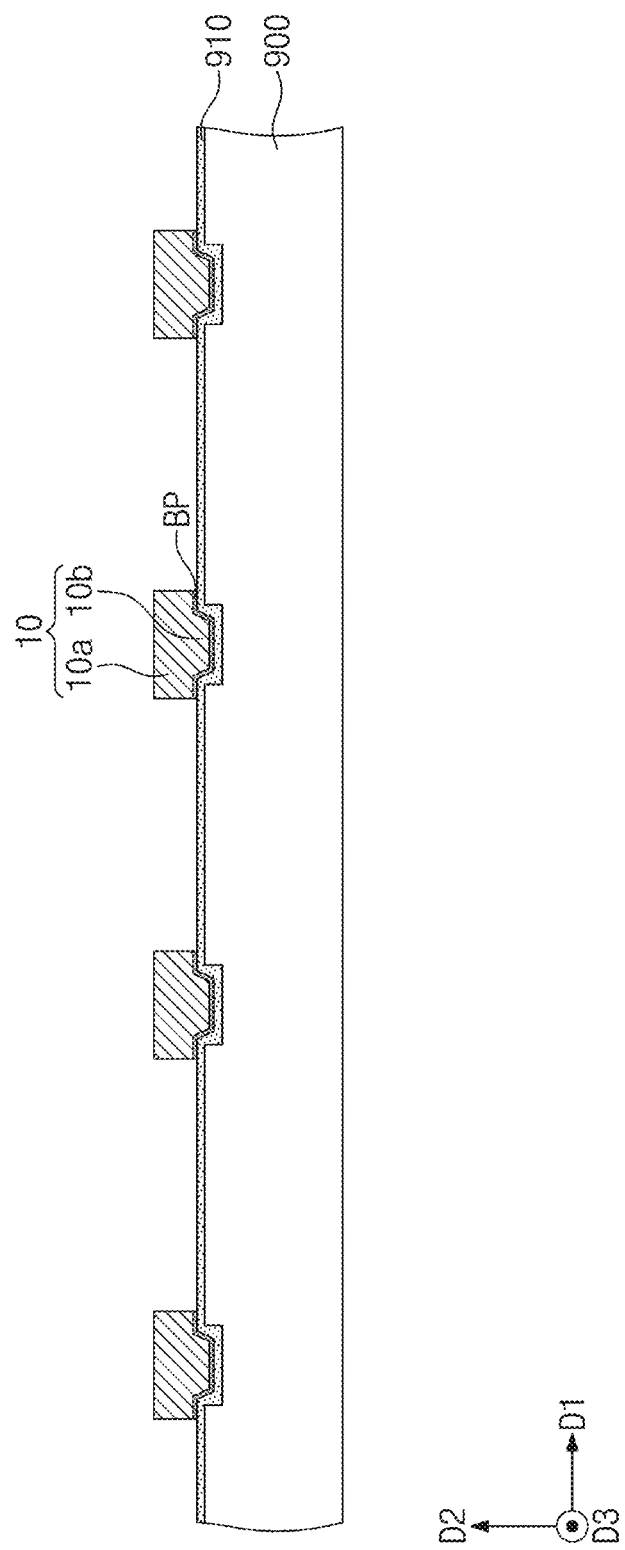

Referring to FIG. 12, the first photomask pattern PM1 may be removed. Next, a wet etching process may be performed on the seed/barrier layer BL to form the seed/barrier pattern BP. A portion of the seed/barrier layer BL exposed by the under-bump pattern 10 may be removed, and the remaining portion of the seed/barrier layer BL covered with the under-bump pattern 10 may not be removed.

Figure 13:
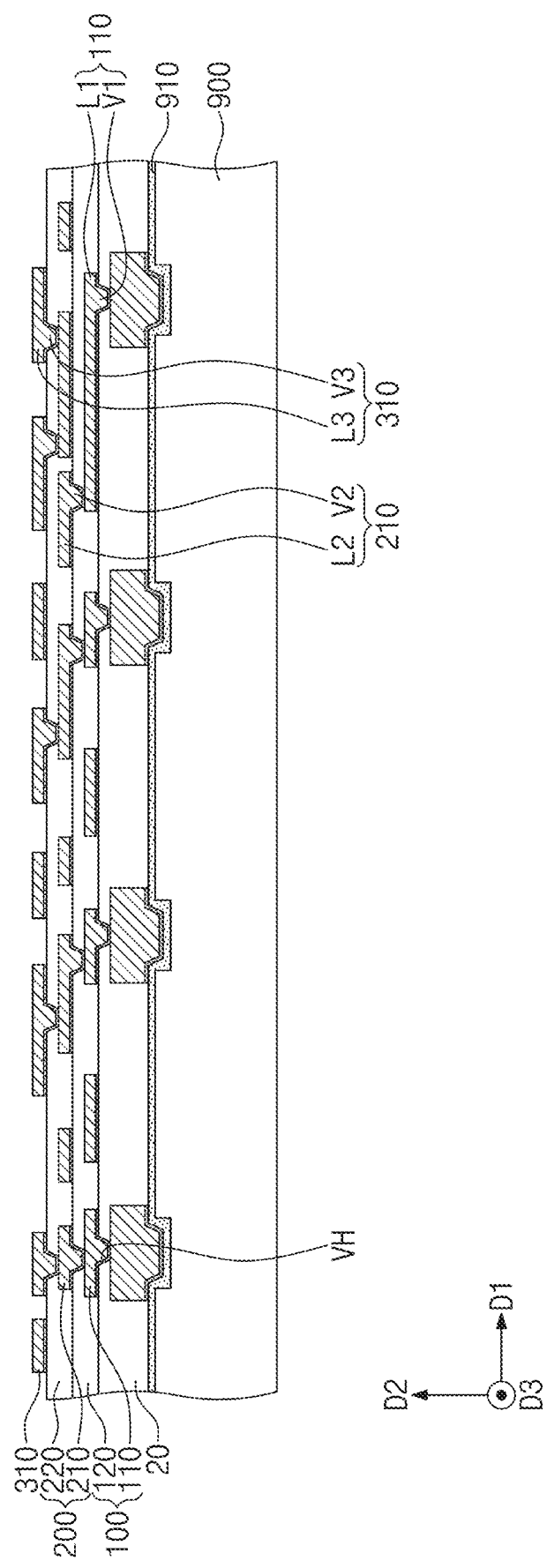

Referring to FIG. 13, the lower insulating layer 20 may be formed to cover the under-bump pattern 10. The formation of the lower insulating layer 20 may be performed by a coating process (e.g., a spin coating process or a slit coating process). By an exposing and developing process, the lower insulating layer 20 may be patterned to have a via hole VH defining the via portion V1 of the first redistribution pattern 110. The via hole VH may expose the top surface of the under-bump pattern 10. A curing process may be performed on the lower insulating layer 20. Thereafter, the first redistribution layer 100, the second redistribution layer 200, and the third redistribution layer 300 may be formed.

Figure 14:
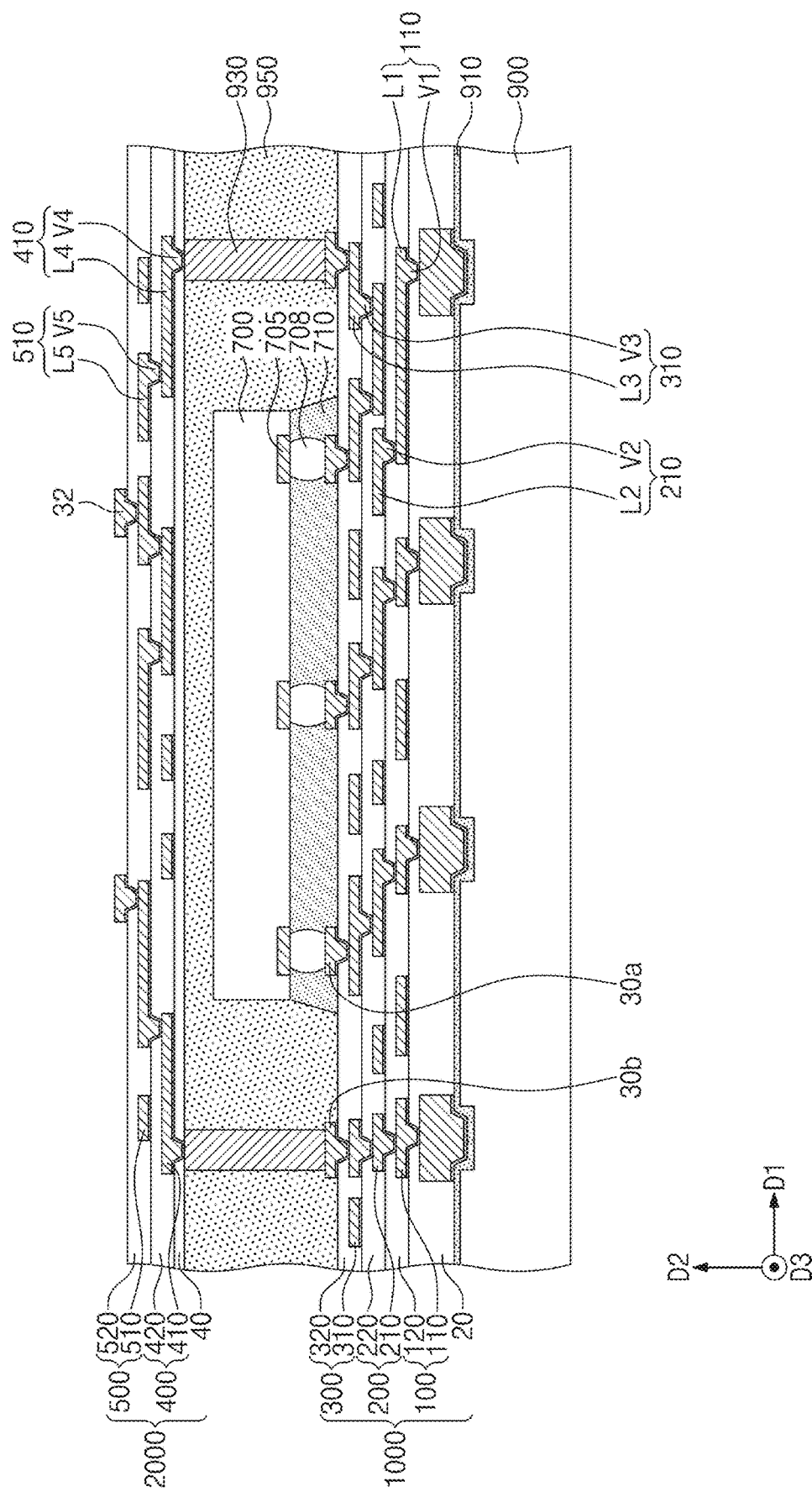

Referring to FIG. 14, the upper insulating layer 40, the first and second lower bonding pads 30a and 30b, and the conductive pillar 930 may be formed on the third redistribution layer 300. The formation of the conductive pillar 930 may include forming a photoresist pattern (not shown), which defines a position and shape for the conductive pillar 930, filling a conductive material, and removing the photoresist pattern.

Thereafter, the first semiconductor chip 700 may be disposed on the lower redistribution substrate 1000 such that the first chip pad 705 of the first semiconductor chip 700 faces the lower redistribution substrate 1000. The process of disposing the first semiconductor chip 700 on the lower redistribution substrate 1000 may include a thermo-compression process.

The under fill 710 may be formed to fill a region between the first semiconductor chip 700 and the lower redistribution substrate 1000. In an embodiment, the process of forming the under fill 710 may be omitted.

The first molding member 950 may be formed to cover the top surface of the lower redistribution substrate 1000, the first semiconductor chip 700, and the conductive pillar 930. The upper redistribution substrate 2000 may be formed on the first molding member 950.

Figure 15:
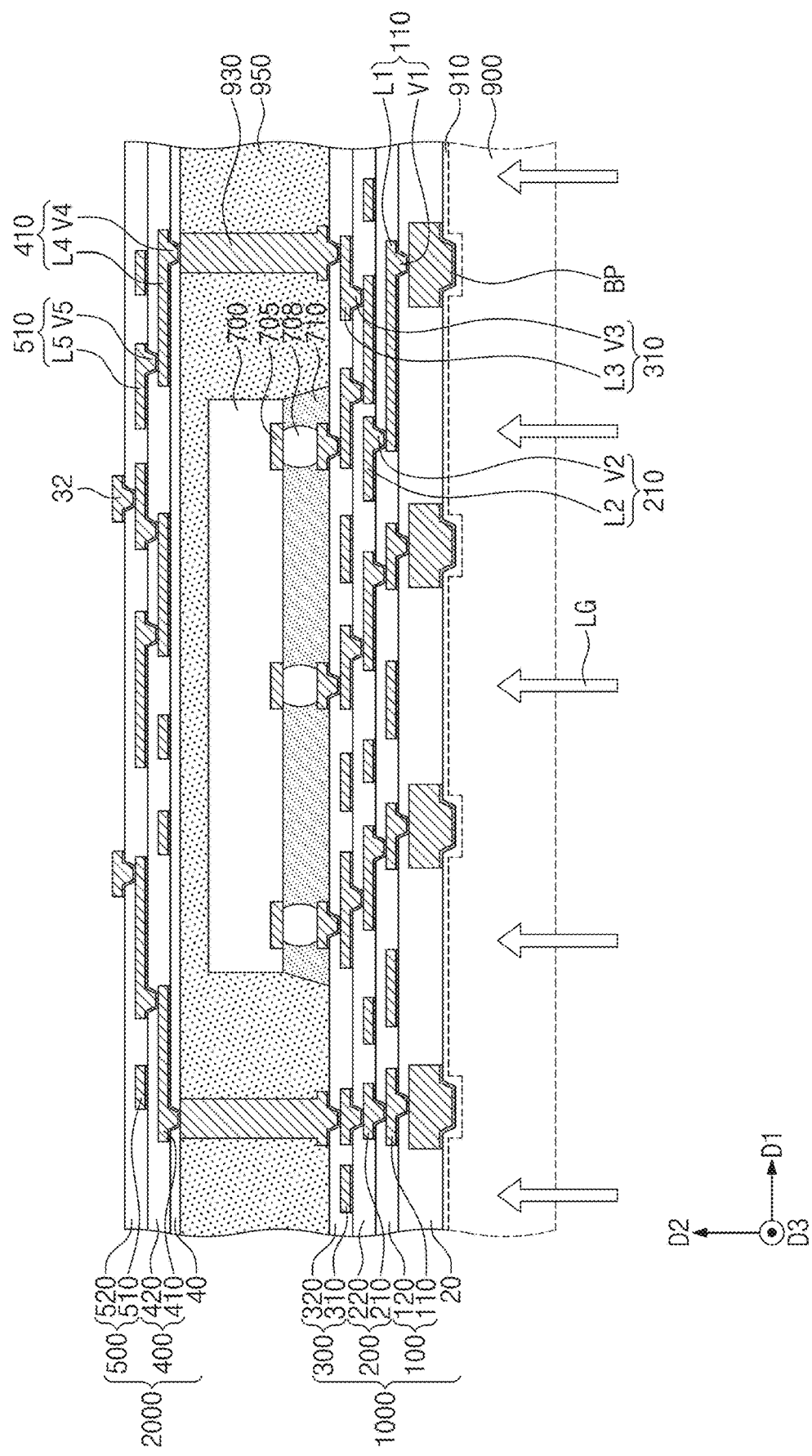

Referring to FIG. 15, a high energy light LG may be irradiated to the resulting structure in the second direction D2. As an example, the high energy light LG may be a laser beam or an ultraviolet light. The high energy light LG may pass through the carrier substrate 900, which is a transparent glass substrate, and may be incident into the adhesive layer 910. Due to a chemical reaction caused by the high energy light LG, the adhesive layer 910 may have a reduced adhesive strength. Thereafter, the carrier substrate 900 may be de-bonded from the lower redistribution substrate 1000 by a physical force. The de-bonded carrier substrate 900 may be re-used for other lower redistribution substrate. In the de-bonding process of the carrier substrate 900, most of the adhesive layer 910 may be detached from the lower redistribution substrate 1000. In an embodiment, a dry etching process (e.g., a descum process) may be performed to remove a portion of the adhesive layer 910 left on the lower redistribution substrate 1000. As a result of the removal of the adhesive layer 910, the lower insulating layer 20 and the seed/barrier pattern BP may be exposed to the outside.

Referring to FIG. 16, a wet etching process may be performed to remove the seed/barrier pattern BP, and thus, the under-bump patterns 10 may be exposed to the outside. As a result of the removal of the seed/barrier pattern BP, the level of the lowermost surface 20b of the lower insulating layer 20 may be lower than the level of the second surface U2 of the body portion 10a, as shown in FIG. 3A.

The outer coupling terminal 908 may be attached to the exposed under-bump patterns 10. Thereafter, a sawing process may be performed along a dash dotted line. The first semiconductor package PK1 may be formed by the sawing process. As previously described with reference to FIG. 3B, the reliability of the first semiconductor package PK1 may be increased in the process of attaching the outer coupling terminal 908 and in the sawing process.

Referring back to FIG. 1, the second semiconductor package PK2 may be mounted on the first semiconductor package PK1, and as a result, the semiconductor package device 1 according to an embodiment of inventive concepts may be fabricated.

Figure 17:
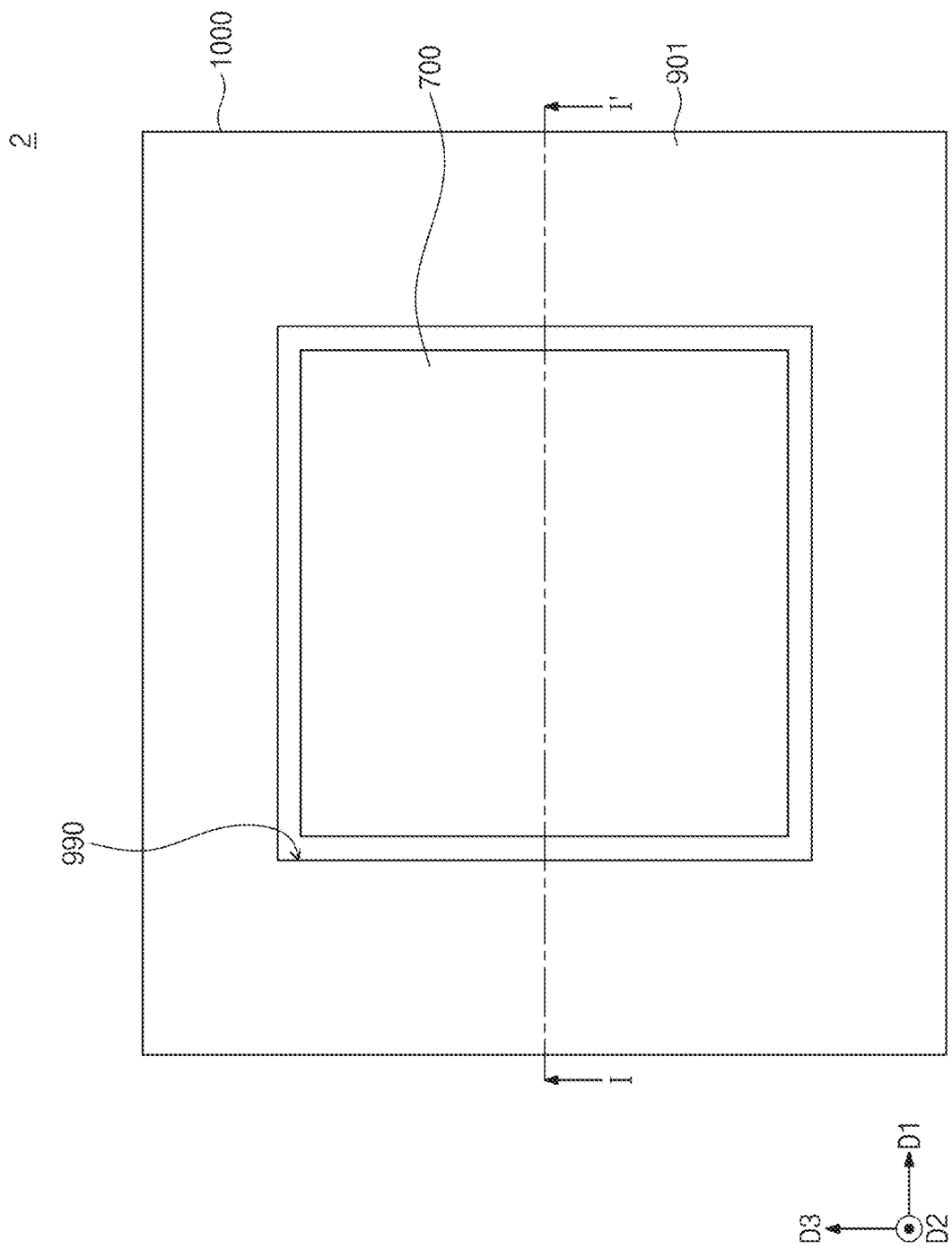
FIG. 17 is a plan view illustrating a semiconductor package device according to an embodiment of inventive concepts.
Figure 18:
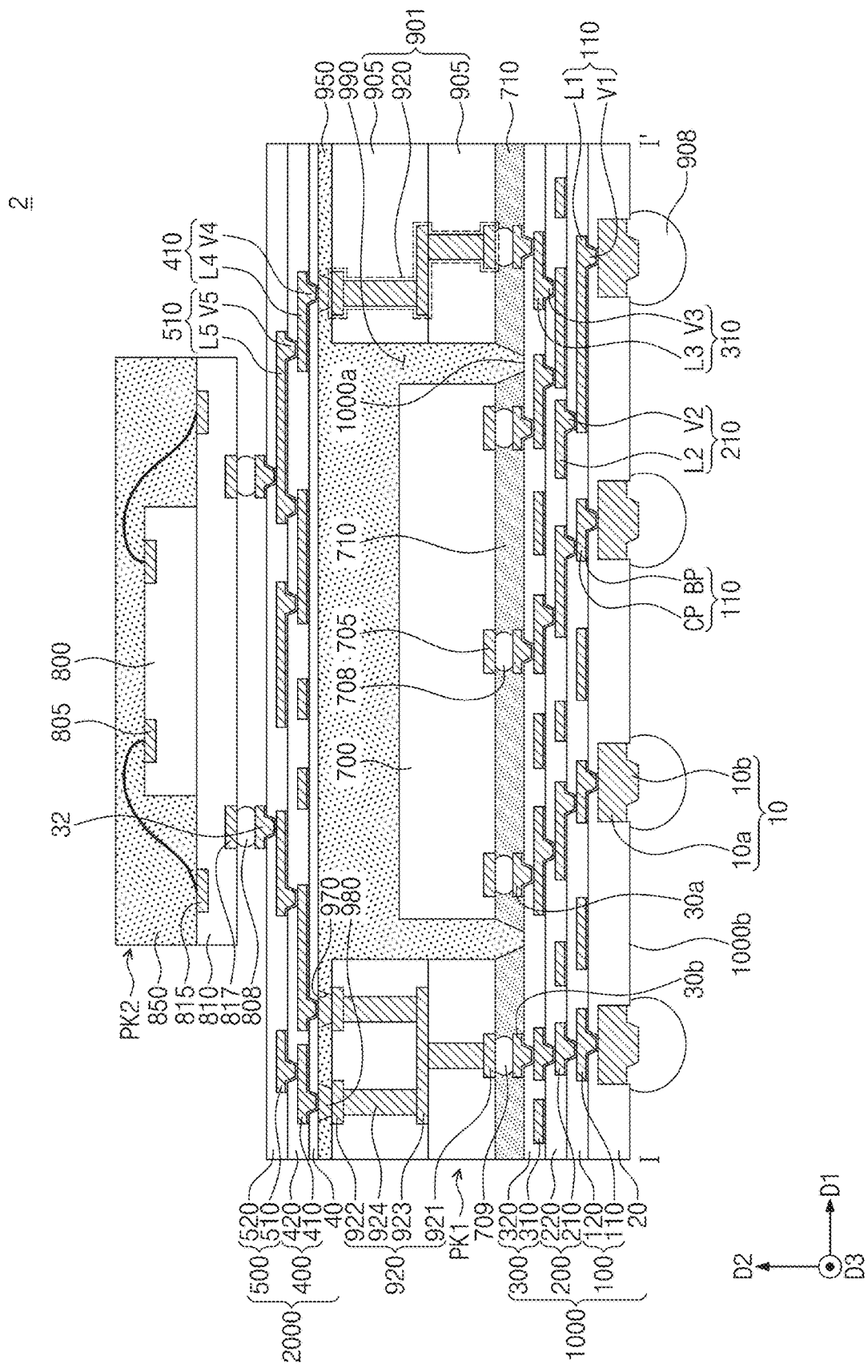
FIG. 18 is a sectional view illustrating a line I-I' of FIG. 17.

FIG. 17 is a plan view illustrating a semiconductor package device 2 according to an embodiment of inventive concepts. FIG. 18 is a sectional view illustrating a line I-I' of FIG. 17. In order to reduce complexity in the drawings and to provide better understanding of this embodiment, some elements of the semiconductor package device 2 may be omitted from FIG. 17. For concise description, an element previously described with reference to FIG. 1 may be identified by the same reference number without repeating an overlapping description thereof.

Referring to FIGS. 17 and 18, the semiconductor package device 2 may include the first semiconductor package PK1 including a connection substrate 901. The connection substrate 901 may be disposed on the first surface 1000a of the lower redistribution substrate 1000.

The lower redistribution substrate 1000 may include the under-bump pattern 10 described with reference to FIG. 1.

The connection substrate 901 may have a hole 990, which is formed to penetrate the connection substrate 901. When viewed in a plan view, the hole 990 may be positioned at a center portion of the lower redistribution substrate 1000. The first semiconductor chip 700 may be provided in the hole 990. The connection substrate 901 may be provided on the lower redistribution substrate 1000. As an example, the connection substrate 901 may be fabricated by forming the hole 990 in a printed circuit board. The connection substrate 901 may include a base layer 905 and a conductive structure 920.

The base layer 905 may be formed of or include at least one of insulating materials. For example, the base layers 905 may be formed of or include at least one of carbon-based materials, ceramics, or polymers. The base layer 905 may be formed of or include an insulating material different from the lower insulating layer 20, the first insulating layer 120, the second insulating layer 220, and the third insulating layer 320 of the lower redistribution substrate 1000.

The hole 990 may be provided to penetrate the base layers 905. The conductive structure 920 may include a first pad 921, a conductive interconnection line 923, vias 924, and a second pad 922.

The first pad 921 may be provided on a bottom surface of the connection substrate 901. The conductive interconnection line 923 may be interposed between the base layers 905. The vias 924 may be provided to penetrate the base layers 905 and may be coupled to the conductive interconnection line 923. The second pad 922 may be disposed on a top surface of the connection substrate 901 and may be coupled to one of the vias 924. The second pad 922 may be electrically connected to the first pad 921 through the vias 924 and the conductive interconnection line 923.

The second pad 922 may not be aligned to the first pad 921 in the vertical direction. The number or the arrangement of the second pads 922 may be different from those of the first pad 921. The conductive structure 920 may be formed of or include at least one of metallic materials. For example, the conductive structure 920 may be formed of or include at least one of copper, aluminum, gold, lead, stainless steel, iron, or alloys thereof.

The connection terminal 708 may be the same as the connection terminal 708 of FIG. 1. A second connection terminal 709 may be interposed between the first pad 921 and second lower bonding pad 30b. The second connection terminal 709 may be in contact with the first pad 921 and second lower bonding pad 30b. The conductive structure 920 may be electrically connected to the lower redistribution substrate 1000 through the second connection terminal 709. The second connection terminal 709 may be formed of or include at least one of conductive materials and may include at least one of solder balls, bumps, and pillars. The under fill 710 may be provided in a gap between the lower redistribution substrate 1000 and the connection substrate 901 to seal the second connection terminal 709.

The first molding member 950 may be provided to fill a gap between the first semiconductor chip 700 and the connection substrate 901. An upper hole 970 may be provided on the first molding member 950 to expose the second pad 922 of the conductive structure 920.

In an embodiment, a conductive portion 980 may be provided in the upper hole 970 to fill the upper hole 970. The conductive portion 980 may be formed of or include at least one of metallic materials.

The upper redistribution substrate 2000 may be provided on a top surface of the first molding member 950. The fourth redistribution pattern 410 may be electrically connected to the conductive portion 980, and the fourth via portion V4 may be in contact with the conductive portion 980.

The second semiconductor package PK2 may be configured to have the same structure as that described with reference to FIG. 1.

According to an embodiment of inventive concepts, it may be possible to improve reliability of a semiconductor package device.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor package device, comprising:
a redistribution substrate, the redistribution substrate including an under-bump pattern, an insulating layer, and an outer coupling terminal,
the under-bump pattern including a body portion and a protruding portion, the protruding portion extending from the body portion to form a single object along with the body portion, the body portion having a first diameter in a first direction parallel to a top surface of the redistribution substrate, the protruding portion having a second diameter in the first direction, the second diameter being smaller than the first diameter, a top surface of the protruding portion being parallel to the first direction, and a side surface of the protruding portion being inclined at an angle to a top surface of the body portion,
the insulating layer covering a side surface of the body portion, and
the outer coupling terminal being on the protruding portion, the protruding portion extending into the outer coupling terminal such that the outer coupling terminal surrounds an entire part of the side surface of the protruding portion, and a contact portion of the outer coupling terminal spaced apart from the body portion and directly contacting a lowermost surface of the insulating layer is lower than a level of a lowermost surface of the body portion and higher than a level of a lowermost surface of the protruding portion;
a diffusion prevention pattern between the under-bump pattern and the outer coupling terminal; and
a semiconductor chip on the top surface of the redistribution substrate,
wherein an entire part of the outer coupling terminal includes at least one of tin or silver,
wherein the diffusion prevention pattern comprises a metallic material different from a material of the under-bump pattern,
a thickness of the diffusion prevention pattern is smaller than a thickness of the under-bump pattern, and
wherein the outer coupling terminal is a solder ball.

2. The semiconductor package device of claim 1, wherein the angle between the side surface of the protruding portion and the top surface of the body portion ranges from 120° to 150°.

3. The semiconductor package device of claim 1, wherein the second diameter increases in a direction from the outer coupling terminal toward the body portion.

4. The semiconductor package device of claim 1, wherein a maximum thickness of the body portion is thicker than a maximum thickness of the protruding portion.

5. The semiconductor package device of claim 4, wherein the thickness of the body portion ranges from 4 μm to 7 μm, and
a thickness of the protruding portion ranges from 1 μm to 3 μm.

6. The semiconductor package device of claim 1, wherein a level of the lowermost surface of the insulating layer is lower than the level of the lowermost surface of the body portion, and
the level of the lowermost surface of the insulating layer is higher than the level of the lowermost surface of the protruding portion.

7. The semiconductor package device of claim 1, further comprising:
an intermetallic compound layer between the under-bump pattern and the outer coupling terminal,
wherein the intermetallic compound layer comprises copper and tin.

8. The semiconductor package device of claim 1, wherein the under-bump pattern comprises copper, and
the diffusion prevention pattern comprises nickel.

9. The semiconductor package device of claim 1, wherein the diffusion prevention pattern comprises a first portion, a second portion, and a third portion,
the first portion covers the top surface of the protruding portion,
the second portion covers the side surface of the protruding portion,
the third portion covers a portion of the top surface of the body portion exposed from the protruding portion,
the second portion connects the first portion to the third portion, and
a level of a bottom surface of the third portion is lower than a level of a bottom surface of the first portion.

10. The semiconductor package device of claim 9, wherein
a top surface of the first portion and a top surface of the third portion are parallel to the first direction, and
a top surface of the second portion is inclined at an angle to the top surface of the first portion and the top surface of the third portion.

11. The semiconductor package device of claim 1, wherein
the insulating layer comprises a photo-sensitive polymer, and
the photo-sensitive polymer comprises at least one of photo-sensitive polyimide, polybenzoxazole, phenol-based polymers, or benzocyclobutene-based polymers.

12. The semiconductor package device of claim 1, further comprising:
a connection terminal;
a conductive pillar; and
a second semiconductor package on a first semiconductor package, wherein
the redistribution substrate is a lower redistribution substrate in the first semiconductor package, the semiconductor chip is a first semiconductor chip in the first semiconductor package and on the lower redistribution substrate, and the first semiconductor package further includes an upper redistribution substrate spaced apart from the first semiconductor chip with the first semiconductor chip being between the upper redistribution substrate and the lower redistribution substrate,
a thickness of the body portion of the under-bump pattern ranges from 4 μm to 7 μm,
a thickness of the protruding portion of the under-bump pattern ranges from 1 μm to 3 μm,
a level of the lowermost surface of the insulating layer is lower than the level of the lowermost surface of the body portion,
the level of the lowermost surface of the insulating layer is higher than the level of the lowermost surface of the protruding portion,
the connection terminal is between the lower redistribution substrate and the first semiconductor chip, and
the conductive pillar is between the lower redistribution substrate and the upper redistribution substrate.

13. The semiconductor package device of claim 12, wherein the angle between the side surface of the protruding portion and the top surface of the body portion ranges from 120° to 150.

* * * * *